(12) United States Patent
Kanemoto et al.

(10) Patent No.: US 8,912,031 B2
(45) Date of Patent: Dec. 16, 2014

(54) ELECTRONIC DEVICE, ELECTRONIC APPARATUS, AND METHOD OF MANUFACTURING ELECTRONIC DEVICE

(75) Inventors: Yoko Kanemoto, Fujimi (JP); Ryuji Kihara, Matsumoto (JP)

(73) Assignee: Seiko Epson Corporation (JP)

( * ) Notice: Subject to any disclaimer, the term of this patent is extended or adjusted under 35 U.S.C. 154(b) by 316 days.

(21) Appl. No.: 13/306,493

(22) Filed: Nov. 29, 2011

(65) Prior Publication Data

US 2012/0134121 A1    May 31, 2012

(30) Foreign Application Priority Data

Nov. 30, 2010   (JP) ................... 2010-266215

(51) Int. Cl.
*H01L 21/00* (2006.01)
*B81C 1/00* (2006.01)

(52) U.S. Cl.
CPC ....... *B81C 1/00801* (2013.01); *B81C 2201/053* (2013.01); *B81B 2207/07* (2013.01); *B81B 2201/0271* (2013.01)
USPC ................. 438/52; 438/50; 438/125

(58) Field of Classification Search
CPC .................................................. B81C 1/00801
See application file for complete search history.

(56) References Cited

U.S. PATENT DOCUMENTS

| | | | |
|---|---|---|---|
| 7,215,061 B2 | 5/2007 | Kihara et al. | |
| 7,408,434 B2 * | 8/2008 | Lee et al. ..................... | 336/200 |
| 7,667,559 B2 | 2/2010 | Yamanaka et al. | |
| 7,709,285 B2 | 5/2010 | Van Beek et al. | |
| 7,709,912 B2 * | 5/2010 | Sato et al. ..................... | 257/414 |
| 7,880,245 B2 | 2/2011 | Sato et al. | |
| 8,026,120 B2 * | 9/2011 | Kihara et al. ................. | 438/50 |
| 8,035,949 B2 | 10/2011 | Miyano | |
| 8,097,483 B2 * | 1/2012 | Van Schaijk et al. ......... | 438/52 |
| 8,631,700 B2 * | 1/2014 | Sammoura et al. ........ | 73/504.12 |
| 2005/0151442 A1 | 7/2005 | Kihara et al. | |
| 2005/0189621 A1 * | 9/2005 | Cheung ....................... | 257/619 |
| 2005/0189845 A1 | 9/2005 | Kihara | |

(Continued)

FOREIGN PATENT DOCUMENTS

| | | |
|---|---|---|
| JP | 06-138142 | 5/1994 |
| JP | 2005-265565 A | 9/2005 |

(Continued)

OTHER PUBLICATIONS

"Study of amine-cured epoxy resin/ aluminum oxide interfactial interaction" Lei et al. 2007.*

(Continued)

*Primary Examiner* — Charles Garber
*Assistant Examiner* — Evren Seven
(74) *Attorney, Agent, or Firm* — Harness, Dickey & Pierce, P.L.C.

(57) ABSTRACT

An electronic device includes: a vibrator disposed within a cavity on a substrate and electrically driven; an enclosure wall which has electric conductivity and sections the cavity from an insulation layer surrounding the circumference of the cavity; a first wiring and a second wiring which connect with the vibrator and penetrate the enclosure wall; and a liquid flow preventing portion disposed at the position where the first wiring and the second wiring penetrate the enclosure wall to prevent flow of etchant dissolving the insulation layer from the cavity toward the insulation layer and insulate the first wiring and the second wiring from the enclosure wall.

13 Claims, 12 Drawing Sheets

(56) References Cited

U.S. PATENT DOCUMENTS

| | | | |
|---|---|---|---|
| 2007/0018761 A1* | 1/2007 | Yamanaka et al. | 335/78 |
| 2008/0079142 A1 | 4/2008 | Carmona et al. | |
| 2009/0108381 A1* | 4/2009 | Buchwalter et al. | 257/415 |
| 2009/0284892 A1 | 11/2009 | Miyano | |
| 2009/0309613 A1 | 12/2009 | Hollocher et al. | |
| 2010/0087024 A1* | 4/2010 | Hawat et al. | 438/51 |
| 2010/0116632 A1 | 5/2010 | Smith et al. | |
| 2010/0176898 A1 | 7/2010 | Kihara | |
| 2010/0178717 A1 | 7/2010 | Kihara et al. | |
| 2010/0237738 A1 | 9/2010 | Smith et al. | |
| 2011/0089521 A1 | 4/2011 | Sato et al. | |
| 2011/0115036 A1* | 5/2011 | Moon et al. | 257/415 |
| 2011/0306153 A1* | 12/2011 | Kihara et al. | 438/10 |
| 2012/0007527 A1 | 1/2012 | Miyano | |
| 2012/0134121 A1 | 5/2012 | Kanemoto et al. | |
| 2013/0140655 A1* | 6/2013 | Yeh et al. | 257/416 |

FOREIGN PATENT DOCUMENTS

| | | | | |
|---|---|---|---|---|
| JP | 2006-247820 A | 9/2006 | | |
| JP | 2008-091167 A | 4/2008 | | |
| JP | 2009-201317 A | 9/2009 | | |
| JP | 2009-005408 | * 7/2010 | | H03H 9/02 |
| JP | 2010-158734 A | 7/2010 | | |

OTHER PUBLICATIONS

D. Sparks, et al. "Chip-Level Vacuum Packaging of Micromachines Using NanoGetters", IEEE Transactions on Advanced Packaging, vol. 26, No. 3, Aug. 2003 (10 pages).

* cited by examiner

ELECTRONIC DEVICE, ELECTRONIC APPARATUS, AND METHOD OF MANUFACTURING ELECTRONIC DEVICE

BACKGROUND

1. Technical Field

The present invention relates to an electronic device, an electronic apparatus, and a method of manufacturing an electronic device, and more particularly to an electronic device which has a cavity.

2. Related Art

An electronic device containing a function element produced by using MEMS (micro electro mechanical systems) technology is known, which element is disposed within a cavity on a substrate. The function element such as a micro vibrator and a micro sensor has a small structure which vibrates, deforms, or performs other actions. The pressure within the cavity is reduced so that the function element can easily operate.

The method of producing the cavity is disclosed in JP-A-2009-105411. According to the method shown in this reference, an interlayer insulation film is initially formed on an MEMS structure prepared on a substrate. Then, a first covering layer having through holes is so formed as to cover the interlayer insulation film around the MEMS structure. After formation of the first covering layer, etchant is introduced through the through holes of the first covering layer to remove the interlayer insulation film and make a movable unit of the MEMS structure movable. Finally, the through holes of the first covering layer are covered with a second covering layer so as to produce a closed cavity around the MEMS structure. The first covering layer is hereinafter referred to as a covering portion.

In case of the MEMS structure which is electrically driven, the covering portion provided thereon is made of material having electric conductivity so as to prevent entrance of electromagnetic wave noise into the cavity. In this case, wires connected with the MEMS structure needs to be insulated from the covering portion so as to allow extraction of electric signals to the outside of the covering portion.

When an interlayer insulation film is disposed between the wires and the covering portion, this interlayer insulation film is dissolved by etchant. In this case, the etchant having dissolved the interlayer insulation film flows toward the area around the covering portion, which may damage components disposed around the covering portion. For example, when an interlayer insulation film is provided around the covering portion, the enchant damages this interlayer insulation film around the covering portion. As a result, the strength of the covering portion lowers to such a degree that the cavity is difficult to be maintained. Accordingly, such an electronic device which can prevent flow of enchant to the outside of the covering portion has been demanded.

SUMMARY

An advantage of some aspects of the invention is to provide a technology capable of solving at least a part of the aforementioned problems and the invention can be implemented as the following forms or application examples.

APPLICATION EXAMPLE 1

This application example is directed to an electronic device including: a function element disposed within a cavity on a substrate and electrically driven; a covering portion which has electric conductivity and sections the cavity from an interlayer insulation film surrounding the circumference of the cavity; a wiring which connects with the function element and penetrates the covering portion; and a liquid flow preventing portion disposed at the position where the wiring penetrates the covering portion to prevent flow of etchant dissolving the interlayer insulation film from the cavity toward the interlayer insulation film and insulate the wiring from the covering portion.

According to the electronic device having this structure, the interlayer insulation film and the cavity disposed on the substrate are sectioned from each other via the covering portion. The function element is provided within the cavity. The wiring is connected with the function element. The wiring penetrates the covering portion. The liquid flow preventing portion is provided between the wiring and the covering portion. The liquid flow preventing portion insulates the wiring from the covering portion. Thus, no current flows between the covering portion and the wiring.

Etchant dissolves the interlayer insulation film to produce the cavity within the covering portion. The covering portion is not easily dissolved by etchant, and thus controls the range of dissolution by etchant. The wiring provided within the cavity is not easily dissolved by etchant as well, and is disposed in such a position as to penetrate the covering portion. When etchant flows out through the clearance between the wiring and the covering portion during formation of the cavity, the interlayer insulation film surrounding the covering portion dissolves. According to the structure of this application example, the liquid flow preventing portion is equipped between the wiring and the covering portion. Thus, flow of etchant out of the covering portion through the clearance between the wiring and the covering portion can be prevented by the presence of the liquid flow preventing portion.

APPLICATION EXAMPLE 2

This application example is directed to the electronic device of the above application example, wherein the liquid flow preventing portion has a corrosion-resistant insulation film more corrosion-resistant to the etchant than the interlayer insulation film; and the corrosion-resistant insulation film is disposed between the wiring and the covering portion.

According to the electronic device having this structure, the corrosion-resistant insulation film is provided between the wiring and the covering portion. The corrosion-resistant insulation film is more corrosion-resistant to etchant than the interlayer insulation film. Thus, the corrosion-resistant film insulates the wiring from the covering portion, and also prevents flow of etchant out of the covering portion through the clearance between the wiring and the covering portion.

APPLICATION EXAMPLE 3

This application example of the invention is directed to the electronic device of the above application example, wherein the interlayer insulation film is made of silicon dioxide; and the corrosion-resistant insulation film is made of alumina.

According to the electronic device having this structure, the interlayer insulation film is made of silicon dioxide, and the corrosion-resistant insulation film is made of alumina. Thus, both the interlayer insulation film and the corrosion-resistant insulation film have insulating characteristics. When HF (hydrogen fluoride) vapor etching is employed for etching, the corrosion-resistant insulation film securely obtains more etching-resistant properties than the interlayer insulation film.

APPLICATION EXAMPLE 4

This application example of the invention is directed to the electronic device of the above application example, wherein the liquid flow preventing portion has a side wall extension which projects from the covering portion toward the interlayer insulation film; and the interlayer insulation film is sandwiched between the side wall extension and the wiring.

According to the electronic device having this structure, the liquid flow preventing portion has the side wall extension projecting from the covering portion toward the interlayer insulation film. Since the interlayer insulation film is provided between the side wall extension and the wiring, the side wall extension is electrically insulated from the wiring. Etchant having formed the cavity flows from the cavity via the covering portion toward the interlayer insulation film between the side wall extension and the wiring, and dissolves the interlayer insulation film. Generally, the etchant having dissolved the interlayer insulation film cannot further dissolve the interlayer insulation film with ease. Thus, the interlayer insulation film disposed in the area to which the etchant cannot easily flow is difficult to be dissolved. According to the structure of this application example, the side wall extension projects, in which arrangement the etchant having entered between the side wall extension and the wiring cannot easily flow and thus cannot easily dissolve the interlayer insulation film. Accordingly, flow of etchant from the cavity toward the interlayer insulation film can be prevented by the presence of the side wall extension.

APPLICATION EXAMPLE 5

This application example of the invention is directed to the electronic device of the above application example, wherein the interlayer insulation film sandwiched between the side wall extension and the wiring has a bending point.

According to the electronic device having this structure, the interlayer insulation film covered by the side wall extension and the wiring has the bending point. The fluid resistance produced during shift of etchant is higher at the bending point than at a linear point. In this case, etchant does not easily flow at the bending point, and therefore the interlayer insulation film sandwiched between the side wall extension and the wiring is difficult to be dissolved. Accordingly, flow of etchant from the cavity toward the interlayer insulation film can be prevented by the presence of the side wall extension.

APPLICATION EXAMPLE 6

This application example is directed to an electronic apparatus including an oscillation circuit. This oscillation circuit includes the electronic device of the above application example.

The electronic apparatus having this structure includes the oscillation circuit provided with the electronic device described above as an electronic device producing a waveform. This electronic device is a high-quality device capable of preventing flow of etchant from its covering portion. Thus, the electronic apparatus of this application example becomes an excellent electronic apparatus equipped with a high-quality electronic device.

APPLICATION EXAMPLE 7

This application example is directed to a method of manufacturing an electronic device including: forming a wiring connected with a function element provided on a substrate; forming a corrosion-resistant insulation film covering the wiring; forming an interlayer insulation on the substrate, the wiring, and the corrosion-resistant insulation film; removing the interlayer insulation film in such a column shape as to surround the function element, and forming a side wall at the position from which the interlayer insulation film is removed; forming a cover having an opening and disposed at a position overlapping with the side wall and the interlayer insulation film surrounded by the side wall; forming a protection film on the interlayer insulation film surrounding the side wall; supplying etchant through the opening to remove the interlayer insulation film in the area surrounded by the substrate, the side wall, and the cover by etching, and to form a cavity; and sealing the opening. The corrosion-resistant insulation film more difficult to be etched than the interlayer insulation film is formed between the wiring and the side wall when the corrosion-resistant insulation film is formed.

According to the method of manufacturing the electronic device of this application example, the wiring connected with the function element provided on the substrate is formed. The corrosion-resistant insulation film is formed on the wiring. The interlayer insulation film is formed on the substrate, the wiring, and the corrosion-resistant insulation film. The interlayer insulation film is removed in such a column shape as to surround the function element, and the side wall is formed at the position from which the interlayer insulation film is removed. According to this structure, the interlayer insulation film is positioned in the area surrounded by the side wall.

The cover having the opening is formed at the position overlapped with the side wall and the interlayer insulation film surrounded by the side wall. The protection film is formed on the interlayer insulation film surrounding the side wall. According to this structure, the interlayer insulation film surrounding the side wall is not etched. The interlayer insulation film provided in the area surrounded by the side wall and the cover is etched and removed by etching through the opening to produce the cavity. Etchant may be introduced through the opening either in spray or in liquid. The opening is sealed to close the cavity.

The function element is provided on the substrate. The wiring is connected with the function element. The corrosion-resistant insulation film is provided to cover the wiring. The side wall is provided on the corrosion-resistant insulation film. In this structure, the wiring is insulated from the side wall. The corrosion-resistant insulation film is made of a film more etching-resistant than the interlayer insulation film. Thus, the corrosion-resistant insulation film remains between the wiring and the side wall when the interlayer insulation film surrounded by the side wall is etched. Accordingly, flow of etchant out of the area surrounded by the side wall through the clearance between the wiring and the side wall can be prevented.

APPLICATION EXAMPLE 8

This application example is directed to a method of manufacturing an electronic device including: forming a wiring connected with a function element provided on a substrate; forming an interlayer insulation film covering the substrate and the wiring; removing the interlayer insulation film in a such a column shape as to surround the function element, and forming a side wall at the position from which the interlayer insulation film is removed; forming a side wall extension extended from the position where the side wall and the wiring cross each other along the wiring located on the periphery of the side wall; forming a cover having an opening and disposed at a position overlapping with the side wall and the interlayer insulation film surrounded by the side wall; forming a protection film on the interlayer insulation film surrounding the side wall; supplying etchant through the opening to remove the interlayer insulation film in the area surrounded by the substrate, the side wall, and the cover by etching, and to form a cavity; and sealing the opening. The wiring is covered by the interlayer insulation film when the interlayer insulation film is formed. The interlayer insulation film covering the wiring is further covered by the side wall extension when the side wall extension is formed.

According to the method of manufacturing the electronic device of the above application example, the wiring connecting with the function element provided on the substrate is formed. The interlayer insulation film covering the substrate and the wiring is formed. The interlayer insulation film provided on the substrate and the wiring is removed in such a column shape as to surround the function element. The side wall is formed at the position from which the interlayer insulation film is removed.

The interlayer insulation film covering the wiring and disposed from the position where the side wall and the wiring cross each other along the wiring on the periphery of the side wall is further covered by the side wall extension. According to this structure, the wiring is insulated from the side wall extension. The cover having the opening is formed at the position overlapping with the side wall and the interlayer insulation film surrounded by the side wall. The protection film is formed on the interlayer insulation film surrounding the side wall. According to this structure, the interlayer insulation film surrounding the side wall is not etched. The interlayer insulation film provided in the area surrounded by the side wall and the cover is etched and removed by etching through the opening to produce the cavity. The opening is sealed to close the cavity.

The function element is provided on the substrate. The wiring is connected with the function element. The interlayer insulation film is provided on the wiring. The side wall and the side wall extension covering the interlayer insulation film are provided. According to this structure, etchant does not easily flow out of the area surrounded by the side wall through the clearance between the wiring and the side wall extension compared with the structure which does not have the side wall extension. Accordingly, flow of etchant from the area surrounded by the side wall through the clearance between the wiring and the side wall extension to the outside can be prevented.

APPLICATION EXAMPLE 9

This application example of the invention is directed to the method of manufacturing the electronic device of the above application example, wherein an MOS element is provided on the substrate; and at least one of the wiring and the interlayer insulation film is formed in a process where the MOS element is formed.

According to the method of manufacturing the electronic device of the above application example, the wiring and the interlayer insulation film are equipped on the MOS (metal oxide semiconductor) element. The forming of the wiring on the function element and the forming of the wiring on the MOS element are performed in the same process. Moreover, the step for forming the interlayer insulation film on the function element and the step for forming the interlayer insulation film on the MOS element are performed in the same process. Thus, the function element and the MOS element can be produced with higher productivity than by a method which forms the function element and the MOS element on the substrate in separate processes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments according to the invention are hereinafter described with reference to the drawings. The scales of the components shown in the respective figures are varied for each so that these components can be easily recognized in the figures.

First Embodiment

Described in this embodiment are a resonator which has a vibrator disposed within a cavity to output a waveform of a predetermined frequency, and a characterized example of a method for manufacturing this resonator with reference to FIGS. 1 through 7C.

Resonator

Figure 1:
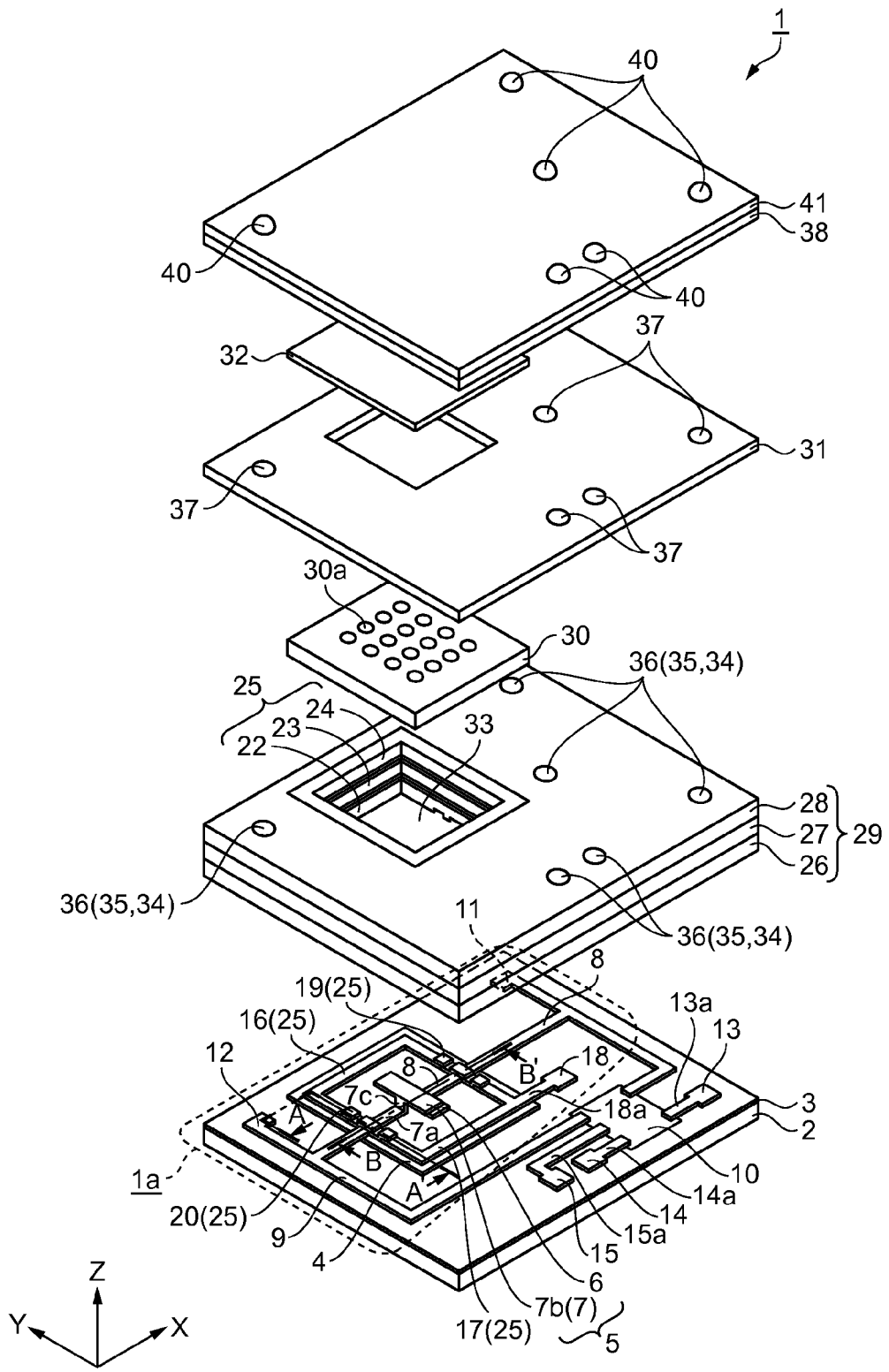
FIG. 1 is a perspective view illustrating the general disassembled structure of a resonator according to a first embodiment.
Figure 2A:
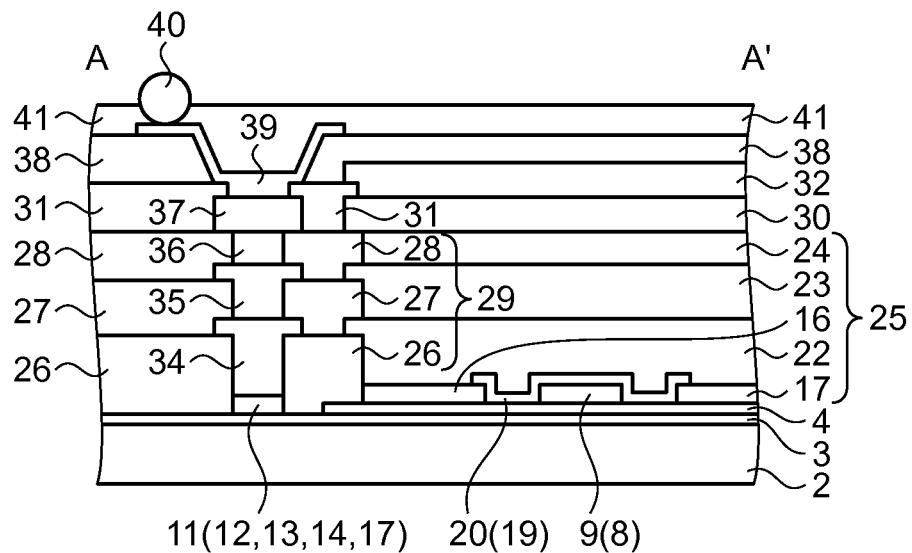
FIG. 2A is a cross-sectional view schematically illustrating the resonator taken along a line A-A' in FIG. 1.
Figure 2B:
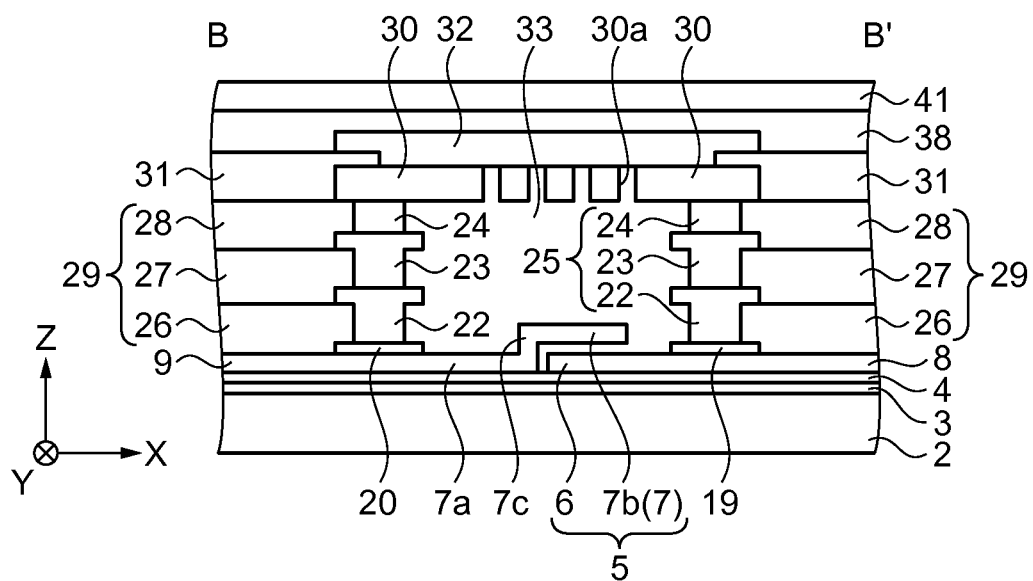
FIG. 2B is a cross-sectional view schematically illustrating the resonator taken along a line B-B' in FIG. 1.

FIG. 1 is a perspective view illustrating the general disassembled structure of the resonator. FIG. 2A is a cross-sectional view schematically illustrating the resonator taken along a line A-A' in FIG. 1. FIG. 2B is a cross-sectional view illustrating the resonator taken along a line B-B' in FIG. 1. Initially, the structure of the resonator 1 is explained in conjunction with FIG. 1 and FIGS. 2A and 2B. The resonator 1 as an electronic device has a rectangular substrate 2. The longitudinal direction of the substrate 2 corresponds to an X direction, while the direction perpendicular to the X direction along the plane of the substrate 2 corresponds to a Y direction. The thickness direction of the substrate 2 corresponds to a Z direction. The material of the substrate 2 is not particularly limited but may be selected from various types of materials such as a semiconductor substrate including a silicon substrate, a ceramic substrate, a glass substrate, a sapphire substrate, and a synthetic resin substrate. For the substrate 2 on which an integrated circuit containing a semiconductor is provided, a semiconductor substrate such as a silicon substrate is used. According to this embodiment, the substrate 2 is constituted by a silicon substrate, for example. The thickness of the substrate 2 is not specifically limited. In this embodiment, this thickness lies in the range from 200 μm to 600 μm, for example.

A first base layer 3 is provided on the substrate 2. The first base layer 3 is made of trench insulation layer, a LOCOS (local oxidation of silicon) insulation layer, or a semi-recessed LOCOS insulation layer, for example. The first base layer 3 functions as an insulation layer which electrically insulates a plurality of elements formed on the substrate 2 from one another.

A second base layer 4 is provided on a part of the first base layer 3. The material of the second base layer 4 may be any materials as long as they are corrosion-resistant to etchant used for etching silicon dioxide film. For example, the second base layer 4 may be made of alumina. In this case, the second base layer 4 functions as an etching stopper layer during etching on the second base layer 4.

A vibrator 5 as a function element is provided on the second base layer 4 in the vicinity of the center thereof. The vibrator 5 has a fixed electrode 6 and a movable electrode 7. The fixed electrode 6 is disposed on the second base layer 4. The movable electrode 7 has a fixed portion 7a, a movable portion 7b, and a support portion 7c. The fixed portion 7a is disposed on the second base layer 4. The movable portion 7b is disposed at a position opposed to the fixed electrode 6. The support portion 7c is so disposed as to connect the movable portion 7b and the fixed portion 7a, and support the movable portion 7b. The movable portion 7b has cantilevered structure supported by the support portion 7c. This structure allows vibration of the movable portion 7b to change the distance between the movable portion 7b and the fixed electrode 6.

A first wiring 8 and a second wiring 9 both functioning as wires are disposed on the second base layer 4. The first wiring 8 is connected with the fixed electrode 6, while the second wiring 9 is connected with the movable electrode 7. A driving circuit 10 is provided on the first base layer 3. A first intermediate terminal 11 and a second intermediate terminal 12 are further provided on the first base layer 3. One end of the first wiring 8 is connected with the driving circuit 10, while the other end of the first wiring 8 is connected with the first intermediate terminal 11. One end of the second wiring 9 is connected with the driving circuit 10, while the other end of the second wiring 9 is connected with the second intermediate terminal 12. A voltage signal applied to the vibrator 5 can be detected through detection of voltage between the first intermediate terminal 11 and the second intermediate terminal 12.

The driving circuit 10 includes electric elements such as transistors and capacitors to output a driving signal to the vibrator 5. A third intermediate terminal 13, a fourth intermediate terminal 14, and a fifth intermediate terminal are provided on the first base layer 3. The third intermediate terminal 13 is connected with the driving circuit 10 via a wiring 13a, while the fourth intermediate terminal 14 is connected with the driving circuit 10 via a wiring 14a. Similarly, the fifth intermediate terminal 15 is connected with the driving circuit 10 via a wiring 15a. The third intermediate terminal 13 is a terminal for a ground line. The fourth intermediate terminal 14 is a terminal for power supply. The fifth intermediate terminal 15 is a terminal for signal output. The driving circuit 10 is a circuit which produces a voltage signal having a predetermined frequency, and outputs the voltage signal to the fifth intermediate terminal 15. In other words, the resonator 1 is an oscillator which has both the vibrator 5 and the driving circuit 10 disposed on the same substrate 2. The parts of the resonator 1 other than the driving circuit 10 are collectively referred to as an oscillation device 1a.

A first enclosure wall 16 is disposed on the second base layer 4 on the +Y side of the vibrator 5, and a second enclosure wall 17 is disposed on the second base layer 4 on the −Y side of the vibrator 5. One end of the first enclosure wall 16 extends to the vicinity of the first wiring 8, while the other end of the first enclosure wall 16 extends to the vicinity of the second wiring 9. Similarly, one end of the second enclosure wall 17 extends to the vicinity of the first wiring 8, while the other end of the second enclosure wall 17 extends to the vicinity of the second wiring 9. A sixth intermediate terminal 18 is provided in the vicinity of the second enclosure wall 17 and connected therewith via a wiring 18a.

A first corrosion-resistant insulation film 19 functioning as a corrosion-resistant insulation film and as a liquid flow preventing portion is provided on the +X side of the vibrator 5 in such a position as to cross over the first wiring 8 and connect the first enclosure wall 16 and the second enclosure wall 17. More specifically, the first corrosion-resistant insulation film 19 disposed on the first enclosure wall 16 reaches the upper surface of the first wiring 8 via the second base layer 4 interposed between the first enclosure wall 16 and the first wiring 8. The first corrosion-resistant insulation film 19 positioned on the first wiring 8 further reaches the upper surface of the second enclosure wall 17 via the second base layer 4 interposed between the first wiring 8 and the second enclosure wall 17. The second base layer 4 is provided on the area surrounded by the first enclosure wall 16 and the second enclosure wall 17 and the area surrounding the two enclosure walls 16 and 17. According to this structure, the area of the substrate 2 surrounded by the first enclosure wall 16 and the second enclosure wall 17 is covered by the second base layer 4. A second corrosion-resistant insulation film 20 functioning as a corrosion-resistant insulation film and as a liquid flow preventing portion is provided on the −X side of the vibrator 5 in such a position as to cross over the second wiring 9 and connect the first enclosure wall 16 and the second enclosure wall 17. The detailed positioning of the second corrosion-resistant insulation film 20 is similar to that of the first corrosion-resistant insulation film 19, and the same explanation is not repeated.

The vibrator 5, the first wiring 8, the second wiring 9, the first intermediate terminal 11 through the fifth intermediate terminal 15, the wiring 13a, the wiring 14a, the wiring 15a, the first enclosure wall 16, the second enclosure wall 17, the sixth intermediate terminal 18, and the wiring 18a may be made of any materials as long as they are electrically conductive and corrosion-resistant to etchant used for etching silicon dioxide. For example, these materials may be metal or silicon having electric conductivity. According to this embodiment, polycrystalline silicon doped with an impurity such as phosphor and boron to acquire electric conductivity, or aluminum-copper alloy is employed, for example.

The first corrosion-resistant insulation film 19 and the second corrosion-resistant insulation film 20 may be made of any materials as long as they have both characteristics of electric insulation and corrosion resistance to etchant used for silicon dioxide etching. Preferable examples of these materials include alumina, $Si_3N_4$, polyimide resin, acrylic resin, novolak resin, and diazonaphtoquinone resin. According to this embodiment, the first and second corrosion-resistant films 19 and 20 are made of alumina, for example.

A third enclosure wall 22 is overlapped on the first enclosure wall 16, the second enclosure wall 17, the first corrosion-resistant insulation film 19, and the second corrosion-resistant insulation film 20. A fourth enclosure wall 23 is overlapped on the third enclosure wall 22. A fifth enclosure wall 24 is overlapped on the fourth enclosure wall 23. Each of the third enclosure wall 22 through the fifth enclosure wall 24 has a quadrangular frame shape, and is disposed in such a position as to surround the vibrator 5. The first enclosure wall 16, the second enclosure wall 17, the first corrosion-resistant insulation film 19, the second corrosion-resistant insulation film 20, the third enclosure wall 22, the fourth enclosure wall 23, and the fifth enclosure wall 24 form an enclosure wall 25 surrounding the vibrator 5.

The third enclosure wall 22 through the fifth enclosure wall 24 may be made of any materials as long as they have electric conductivity and sufficient structural strength, and are corrosion-resistant to etchant used for etching silicon dioxide. For example, the materials may be selected from polycrystalline silicon, metals such as aluminum, copper, tungsten, and titanium, and alloys of these materials. According to this embodiment, aluminum-copper alloy is used, for example.

An insulation layer 29 formed by laminating a first insulation layer 26, a second insulation layer 27, and a third insulation layer 28 in this order is disposed around the enclosure wall 25 to function as an interlayer insulation film. The insulation layer 29 may be made of any materials as long as they have electrically insulating characteristics and can be removed by etchant. For example, the insulation layer 29 is made of silicon dioxide.

Each of the first enclosure wall 16, the second enclosure wall 17, the third enclosure wall 22, the fourth enclosure wall 23, and the fifth enclosure wall 24 is made of electrically conductive material and electrically connected with one another. The sixth intermediate terminal 18 is electrically connected with the second enclosure wall 17. Thus, each of the first enclosure wall 16, the second enclosure wall 17, the third enclosure wall 22, the fourth enclosure wall 23, the fifth enclosure wall 24, and the sixth intermediate terminal 18 has the same potential. The first wiring 8 is surrounded by the first enclosure wall 16, the second enclosure wall 17, and the third enclosure wall 22 via the first corrosion-resistant insulation film 19. Since the first corrosion-resistant insulation film 19 is made of material having electrically insulating characteristics, the first wiring 8 is electrically insulated from the first enclosure wall 16, the second enclosure wall 17, and the third enclosure wall 22. Similarly, the second wiring 9 is surrounded by the first enclosure wall 16, the second enclosure wall 17, and the third enclosure wall 22 via the second corrosion-resistant insulation film 20. Since the second corrosion-resistant insulation film 20 is made of material having electrically insulating characteristics, the second wiring 9 is electrically insulated from the first enclosure wall 16, the second enclosure wall 17, and the third enclosure wall 22.

A first sealing layer 30 functioning as a covering portion and as a cover is disposed on the enclosure wall 25 in such a manner as to cover the enclosure wall 25. The first sealing layer 30 has a plurality of through holes 30a as openings. The number and the size of the through holes 30a are not particularly limited. According to this embodiment, the sixteen through holes 30a are formed in the first sealing layer 30, for example. The first sealing layer 30 may be made of any materials as long as they have electrical conductivity and sufficient structural strength, and are corrosion-resistant to etchant used for etching silicon dioxide. According to this embodiment, the first sealing layer 30 has a laminating structure formed by laminating a titanium layer, a titanium nitride layer, an aluminum-copper alloy layer, and a titanium nitride layer in this order, for example.

A protection film 31 is overlapped on the outer peripheral area of the first sealing layer 30 and the third insulation layer 28. The protection film 31 is provided in such a position as not to close the through holes 30a. The protection film 31 may be made of any materials as long as they are corrosion-resistant to etchant used for etching silicon dioxide. Examples of the materials of the protection film 31 include TEOS (tetraethoxysilane) oxide film, and silicon nitride. According to this embodiment, the protection film 31 is made of a lamination film formed by laminating TEOS oxide film and a silicon nitride, for example.

A second sealing layer 32 is laminated on the first sealing layer 30. The second sealing layer 32 closes the through holes 30a of the first sealing layer 30. The second sealing layer 32 may be made of any materials as long as they can form a film having sufficient strength for closing the through holes 30a. Examples of the second sealing layer 32 include metal such as aluminum, titanium, tungsten, and titanium-nickel alloy. According to this embodiment, the second sealing layer 32 is made of aluminum, for example. The thickness of the second sealing layer 32 is not specifically limited. According to this embodiment, this thickness is set at about 3 µm, for example.

The area surrounded by the second base layer 4, the enclosure wall 25, and the first sealing layer 30 corresponds to a cavity 33. The enclosure wall 25 and the first sealing layer 30 correspond to a covering portion covering the cavity 33. The vibrator 5 is disposed within the cavity 33. The atmospheric pressure of the cavity 33 is reduced so that the movable portion 7b of the movable electrode 7 can easily vibrate. The first sealing layer 30 and the second sealing layer 32 function as a sealing member which seals the cavity 33 under the reduced pressure of the cavity 33.

First through electrodes 34 are provided at positions overlapping with the first intermediate terminal 11, the second intermediate terminal 12, the third intermediate terminal 13, the fourth intermediate terminal 14, the fifth intermediate terminal 15, and the sixth intermediate terminal 18. Second through electrodes 35 are provided at positions overlapping with the first through electrodes 34. Third through electrodes 36 are further provided at positions overlapping with the second electrodes 35. Each of the first through electrodes 34, the second through electrodes 35, and the third electrodes 36 is an electrode penetrating the first insulation layer 26, the second insulation layer 27, and the third insulation layer 28.

An electrode pad 37 is provided on each of the third through electrodes 36. The protection film 31 is provided such that each of the electrode pads 37 is exposed through the protection film 31. A resin layer 38 is laminated on the protection film 31 and the second sealing layer 32. The resin layer 38 is not provided above the electrode pads 37. The preferable materials for the resin layer 38 include polyimide resin, silicon modified polyimide resin, epoxy resin, silicon modified epoxy resin, BCB (benzocyclobutene), PBO (polybenzoxazole), and other resins. The thickness of the resin layer 38 is not particularly limited. It is preferable, however, that this thickness is 10 µm or larger, for example. The resin layer 38 having a thickness in this range can absorb stress which may damage the resonator 1 when the resonator 1 is mounted.

A wiring 39 extends from the upper surface of each of the electrode pads 37 to the upper surface of the resin layer 38. The wirings 39 may be made of any materials as long as they have electric conductivity. Examples of the material for the wirings 39 include a metal layer formed by laminating a titanium-tungsten alloy layer and a copper layer in this order, a metal layer having single-layer structure such as a copper layer, a chrome layer, and an aluminum layer, or a laminated layer formed by laminating these metal layers.

External terminals 40 are provided on the wirings 39. The external terminals 40 are electrically connected with the wirings 39. The external terminals 40 may be made of any materials as long as they have electric conductivity, such as various types of metals. According to this embodiment, the external terminals 40 are made of solder, for example. Each of the external terminals 40 has a substantially spherical shape.

A resist layer 41 is laminated on the wirings 39 and the resin layer 38. The resist layer 41 is provided such that a part of each of the external terminals 40 is exposed through the resist layer 41. The resist layer 41 can prevent oxidation and corrosion of the wirings 39 so as to avoid failure caused by electrical conditions.

According to the resonator 1, the external terminals 40 are directly provided at positions above the substrate 2 constituted by a chip-shaped semiconductor substrate, for example, as above. Thus, the package size of the resonator 1 can be made substantially equivalent to the size of the semiconductor chip.

The driving circuit 10 is connected with the fixed electrode 6 via the first wiring 8, and further connected with the movable electrode 7 via the second wiring 9. When voltage is applied to the vibrator 5 from the driving circuit 10, static electricity is generated between the fixed electrode 6 and the movable electrode 7. The movable electrode 7 vibrates with the change of the voltage applied to the vibrator 5, which varies the electrostatic capacity between the fixed electrode 6 and the movable electrode 7. The characteristics of the variations of the electrostatic capacity are determined by the natural frequency of the movable electrode 7. Accordingly, a voltage waveform of a particular frequency can be produced by the use of the vibrator 5.

Under the reduced pressure of the interior of the cavity 33, the movable electrode 7 can vibrate more easily than when the cavity 33 is filled with air. Moreover, both the enclosure wall 25 and the first sealing layer 30 have electric conductivity, and predetermined voltage is kept applied thereto from the sixth intermediate terminal 18. Thus, even when electromagnetic waves are transmitted as noise from the outside of the resonator 1, transmission of electromagnetic waves can be blocked by the enclosure wall 25 and the first sealing layer 30. Accordingly, the effect of the electromagnetic waves as noise imposed on the vibrator 5 can be reduced.

Figures 3A, 3B:
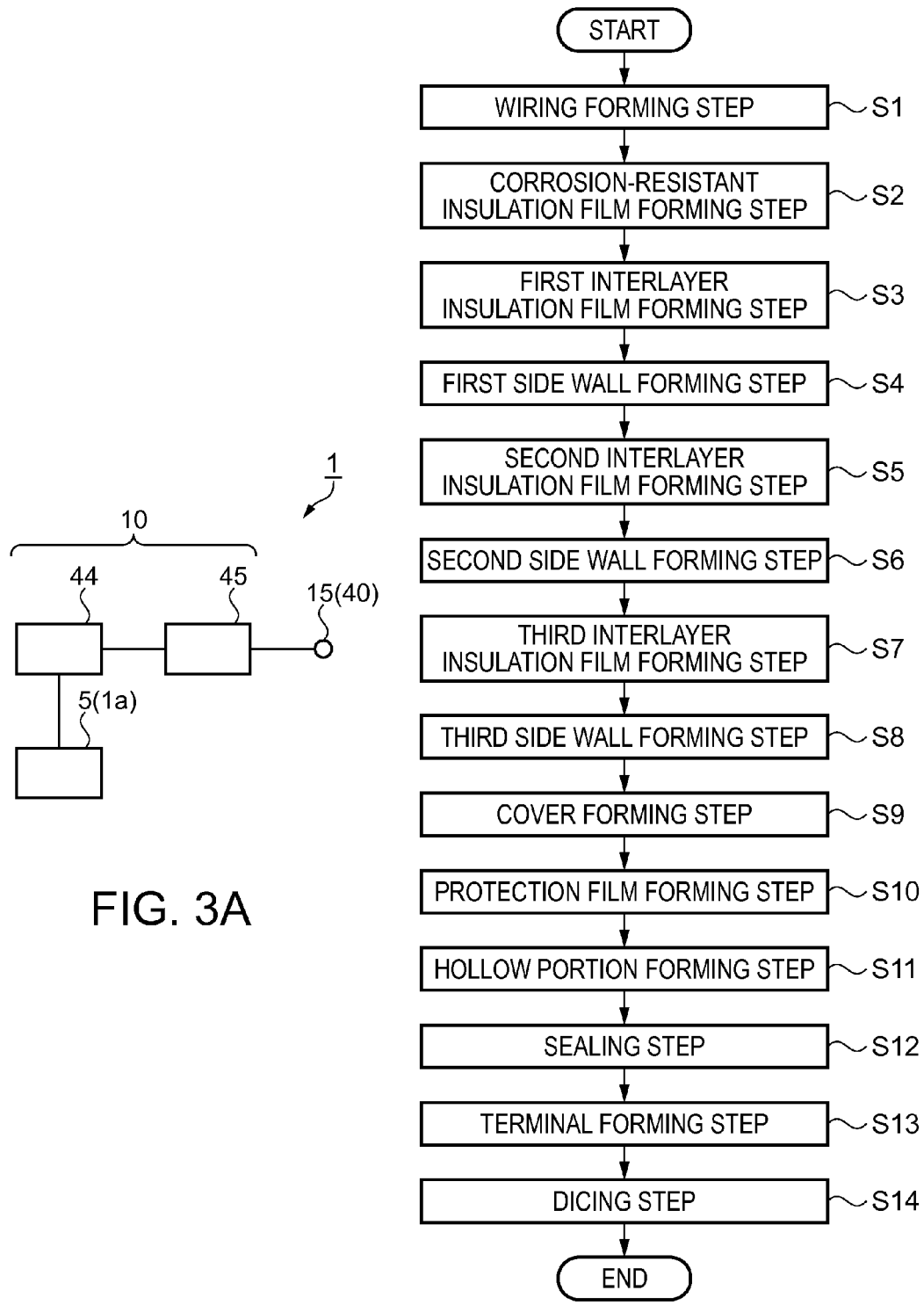
FIG. 3A is a block diagram showing a circuit structure of the resonator.
FIG. 3B is a flowchart showing a method of manufacturing the resonator.

FIG. 3A is a block diagram showing the circuit structure of the resonator. As illustrated in FIG. 3A, the driving circuit 10 included in the resonator 1 has an oscillation circuit 44 and a waveform producing circuit 45. The oscillation circuit 44 is connected with the vibrator 5 to function as a circuit for generating a waveform of a predetermined frequency. The waveform producing circuit 45 has the function of dividing the waveform outputted from the oscillation circuit 44 to change the frequency of the waveform, and the function of changing the shape of the waveform. For example, the waveform producing circuit 45 outputs waveforms such as triangular waves, rectangular waves, and pulse waves. The waveform producing circuit 45 can output a waveform of a frequency lower than the frequency outputted from the oscillation circuit 44.

Resonator Manufacturing Method

The above-mentioned method of manufacturing the resonator 1 is now explained with reference to FIGS. 3B through 7C. FIG. 3B is a flowchart showing the resonator manufacturing method. FIGS. 4A through 7C schematically illustrate the resonator manufacturing method. The methods of manufacturing the driving circuit 10, the third intermediate terminal 13, the fourth intermediate terminal 14, the fifth intermediate terminal 15, and the wirings 13a, 14a, and 15a are known methods, and not specifically explained herein.

In the flowchart shown in FIG. 3B, step S1 corresponds to a wiring forming step which forms the vibrator, the wirings, the intermediate terminals, the first enclosure wall, and the second enclosure wall on the substrate. After the end of step S1, the flow proceeds to step S2. Step S2 corresponds to a corrosion-resistant insulation film forming step which forms the first corrosion-resistant insulation film and the second corrosion-resistant insulation film at positions overlapping with the wirings. After the end of step S2, the flow proceeds to step S3. Step S3 corresponds to a first interlayer insulation film forming step which forms the first insulation layer on the vibrator. After the end of step S3, the flow proceeds to step S4. Step S4 corresponds to a first side wall forming step which forms the third enclosure wall. After the end of step S4, the flow proceeds to step S5.

Step S5 corresponds to a second interlayer insulation film forming step which laminates the second insulation layer on the first insulation layer. After the end of step S5, the flow proceeds to step S6. Step S6 corresponds to a second side wall forming step which forms the fourth enclosure wall at a position overlapping with the third enclosure wall. After the end of step S6, the flow proceeds to step S7. Step S7 corresponds to a third interlayer insulation film forming step which laminates the third insulation layer on the second insulation layer. The first interlayer insulation film forming step in step S3, the second interlayer insulation film forming step in step S5, and the third interlayer insulation film forming step in step S7 constitute an interlayer insulation film forming process. After the end of step S7, the flow proceeds to step S8. Step S8 corresponds to a third side wall forming step which forms the fifth enclosure wall at a position overlapping with the fourth enclosure wall. The first side wall forming step in step S4, the second side wall forming step in step S6, and the third side wall forming step in step S8 constitute a side wall forming process. After the end of step S8, the flow proceeds to step S9. Step S9 corresponds to a cover forming step which laminates the first sealing layer on the position of the fifth enclosure wall and the area surrounded by the fifth enclosure wall. After the end of step S9, the flow proceeds to step S10.

Step S10 corresponds to a protection film forming step which forms the protection film around the first sealing layer. After the end of step S10, the flow proceeds to step S11. Step S11 corresponds to a cavity forming step which forms the cavity by etching the interlayer insulation layer covered by the enclosure walls and the first sealing layer. After the end of step S11, the flow proceeds to step S12. Step S12 corresponds to a sealing step which forms the second sealing layer at a position overlapping with the first sealing layer to seal the cavity. After the end of step S12, the flow proceeds to step S13. Step S13 corresponds to a terminal forming step which forms the external terminals connecting with the intermediate terminals. After the end of step S13, the flow proceeds to step S14. Step S14 corresponds to a dicing step which cuts the mother substrate into chip-shaped pieces. The resonator manufacturing process is now completed after the end of step S14.

Figure 4A:
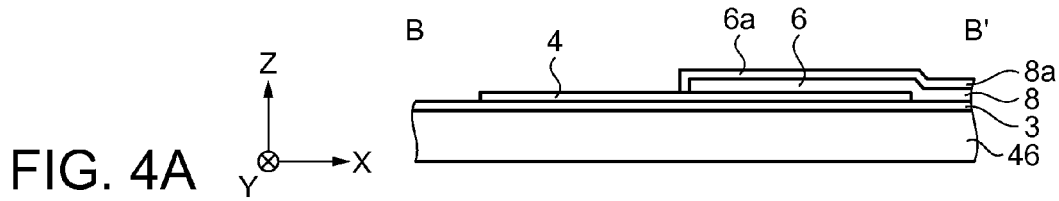
FIGS. 4A through 4E schematically illustrate the method of manufacturing the resonator.

The manufacturing method is herein described in more detail for each step shown in FIG. 3B with reference to FIGS. 4A through 7C. FIGS. 4A through 4C correspond to the wiring forming step in step S1. As illustrated in FIG. 4A, a mother substrate 46 is prepared, and the first base layer 3 and the second base layer 4 are provided on the mother substrate 46. The second base layer 4 is disposed at the position where the enclosure wall 25 is to be formed. The mother substrate 46 is a silicon wafer, for example, and has a sufficient width for producing a plurality of resonators 1. Each part divided from the mother substrate 46 corresponds to the substrate 2. The first base layer 3 is formed by STI (shallow trench isolation) method, LOCOS method, or other methods. The second base layer 4 is formed by CVD (chemical vapor deposition), sputtering, or by other methods.

Then, the fixed electrode 6 is provided on the second base layer 4, and the first wiring 8 is provided on the first base layer 3 and the second base layer 4. In this step, the first intermediate terminal 11 is simultaneously formed. The fixed electrode 6, the first wiring 8, and the first intermediate terminal 11 are formed by a film forming process such as CVD and sputtering, and a patterning process using photolithography technique and etching technique. After a pattern made of polycrystalline silicon is formed, the pattern is doped with a predetermined impurity to acquire electric conductivity. This doping treatment is conducted by accumulating dopants in a gas such as $POCL_3$ and $BBr_3$, and thermally diffusing the dopants. Then, an insulation film 6a and an insulation film 8a are provided on the surfaces of the fixed electrode 6 and the first wiring 8, respectively, by thermal oxidation of the fixed electrode 6 and the first wiring 8. At this time, an oxide film is also formed on the first intermediate terminal 11.

Figure 4B:
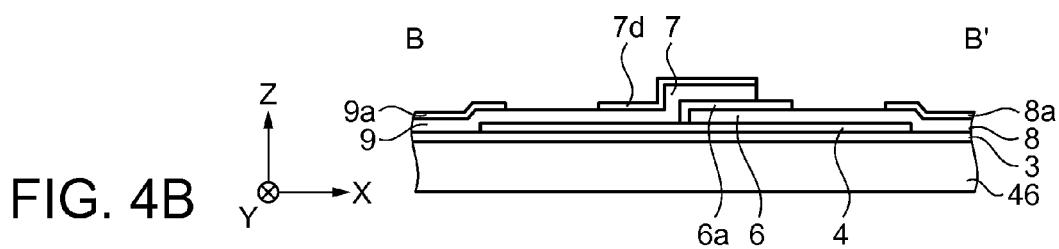
Figure 4C:
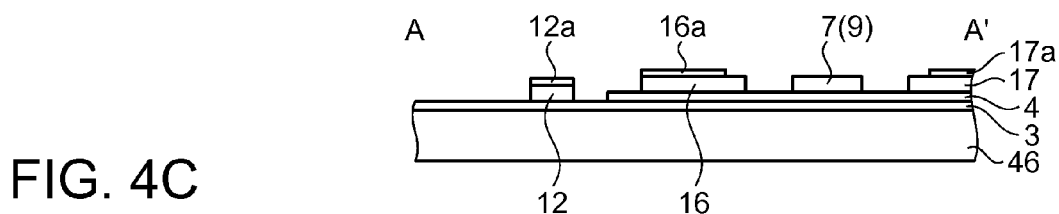

Subsequently, as illustrated in FIGS. 4B and 4C, the movable electrode 7, the second wiring 9, the second intermediate terminal 12, the first enclosure wall 16, and the second enclosure wall 17 are provided. In this step, the sixth intermediate terminal 18 is simultaneously provided. The movable electrode 7, the second wiring 9, the second intermediate terminal 12, the first enclosure wall 16, the second enclosure wall 17, and the sixth intermediate terminal 18 are formed by methods similar to the methods for forming the fixed electrode 6 and the first wiring 8, and the same explanation is not repeated herein. Then, insulation films 7d,9d, 12a, 16a, and 17a are formed on the surfaces of the movable electrode 7, the second wiring 9, the second intermediate terminal 12, the first enclosure wall 16, and the second enclosure wall 17, respectively, by thermal oxidation. At this time, an oxide film is also formed on the sixth intermediate terminal 18.

Then, the insulation films 6a, 7d, 16a, and 17a are removed from the areas where the first corrosion-resistant insulation film 19 and the second corrosion-resistant insulation film 20 are to be formed. For removing the insulation films, a patterning process using photolithography technique and etching technique is employed.

Figure 4D:
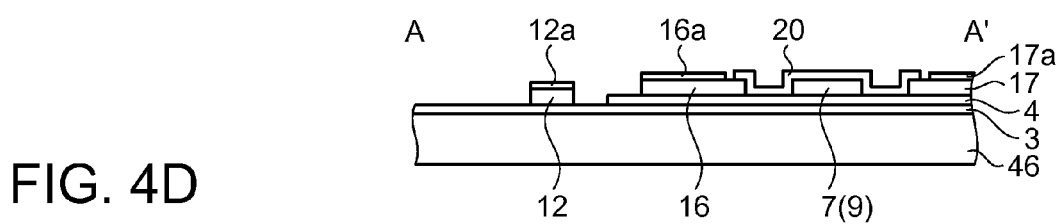
Figure 4E:
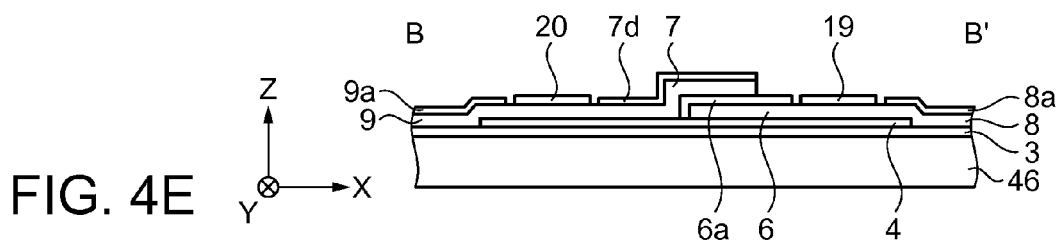

FIGS. 4D and 4E correspond to the corrosion-resistant insulation film forming step in step S2. As illustrated in FIGS. 4D and 4E, the first corrosion-resistant insulation film 19 and the second corrosion-resistant insulation film 20 are so formed as to extend from the end of the first enclosure wall 16 to the end of the second enclosure wall 17. The first corrosion-resistant insulation film 19 covers a part of the upper surface of the first wiring 8, while the second corrosion-resistant insulation film 20 covers a part of the upper surface of the second wiring 9. The first corrosion-resistant insulation film 19 and the second corrosion-resistant insulation film 20 are formed by a film forming process such as CVD and sputtering, and a patterning process using photolithography technique and etching technique.

Figure 5A:
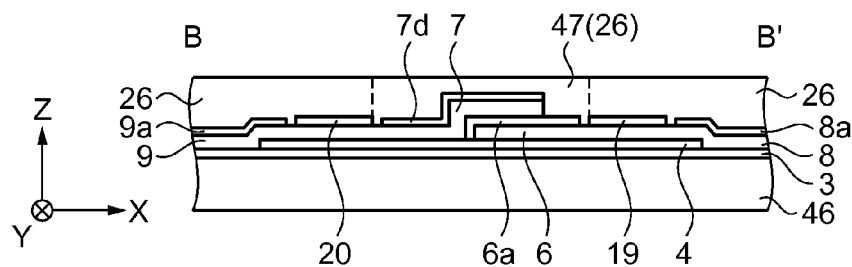
FIGS. 5A through 5C schematically illustrate the method of manufacturing the resonator.

FIG. 5A corresponds to the first interlayer insulation film forming step in step S3. As illustrated in FIG. 5A, the first insulation layer 26 is laminated on the first base layer 3 and the second base layer 4. In this case, the first insulation layer 26 is laminated in such a position as to overlap with the first wiring 8, the second wiring 9, the first corrosion-resistant insulation film 19, and the second corrosion-resistant insulation film 20. The first insulation layer 26 is formed by a film forming process such as CVD and sputtering, or a coating method such as spin coating. After the first insulation layer 26 is formed, a process for flattening the surface of the first insulation layer 26 may be performed. The part of the first insulation layer 26 surrounded by the first enclosure wall 16, the second enclosure wall 17, the first corrosion-resistant insulation film 19, and the second corrosion-resistant insulation film 20 corresponds to a first sacrifice layer 47.

Figure 5B:
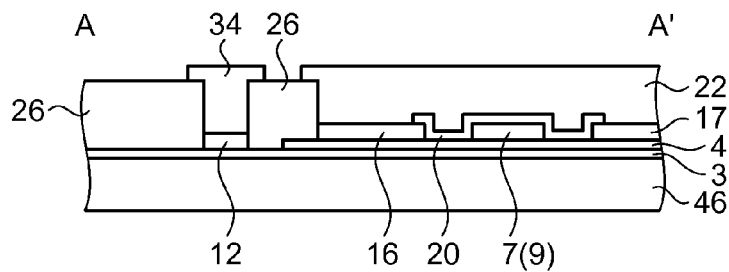
Figure 5C:
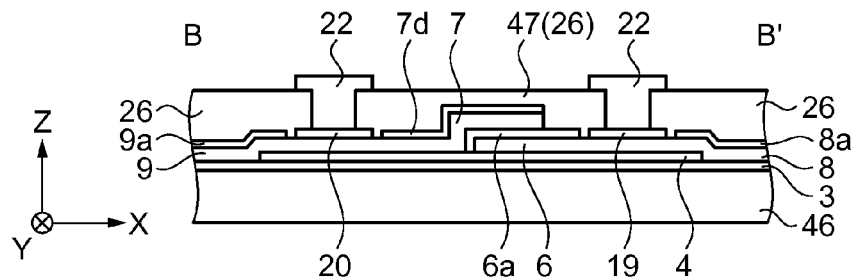

FIGS. 5B and 5C correspond to the first side wall forming step in step S4. As illustrated in FIGS. 5B and 5C, the first insulation layer 26 is patterned. As a result, openings penetrating the area of the first insulation layer 26 where the third enclosure wall 22 and the first through electrodes 34 are provided are formed. The third enclosure wall 22 and the first through electrodes 34 are produced by embedding metal such as aluminum into the openings. The third enclosure wall 22 and the first through electrodes 34 are formed by performing a film forming process such as CVD and sputtering, and then a patterning process using photolithography technique and etching technique. The third enclosure wall 22 and the first through electrodes 34 may be produced either by the same process or separate processes.

The third enclosure wall 22 having electric conductivity is disposed in contact with the first enclosure wall 16 and the second enclosure wall 17. This arrangement produces continuity across the first enclosure wall 16 and the second enclosure wall 17 via the third enclosure wall 22. The first corrosion-resistant insulation film 19 and the second corrosion-resistant insulation film 20 are provided between the third enclosure wall 22 and the first wiring 8 and between the third enclosure wall 22 and the second wiring 9, respectively. Thus, the third enclosure wall 22 is insulated from both the first wiring 8 and the second wiring 9.

The first through electrodes 34 are also disposed in contact with the first intermediate terminal 11, the second intermediate terminal 12, the third intermediate terminal 13, the fourth intermediate terminal 14, and the fifth intermediate terminal 15. This arrangement produces continuity across the first through electrodes 34 and these terminals.

Figure 6A:
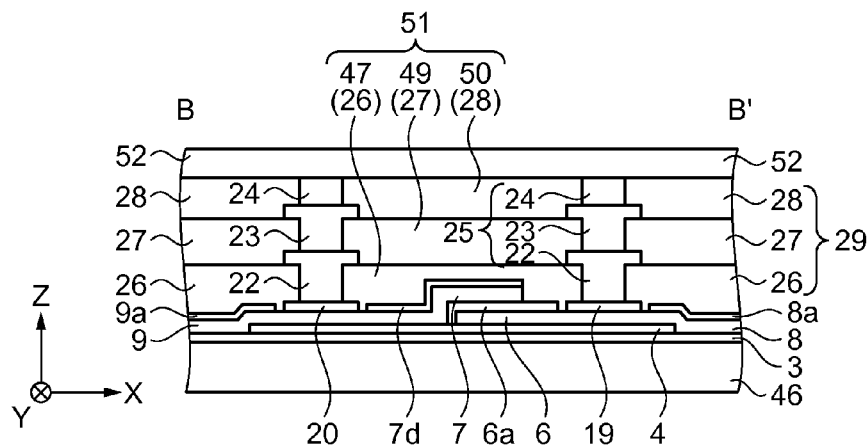
FIGS. 6A through 6C schematically illustrate the method of manufacturing the resonator.
Figure 6B:
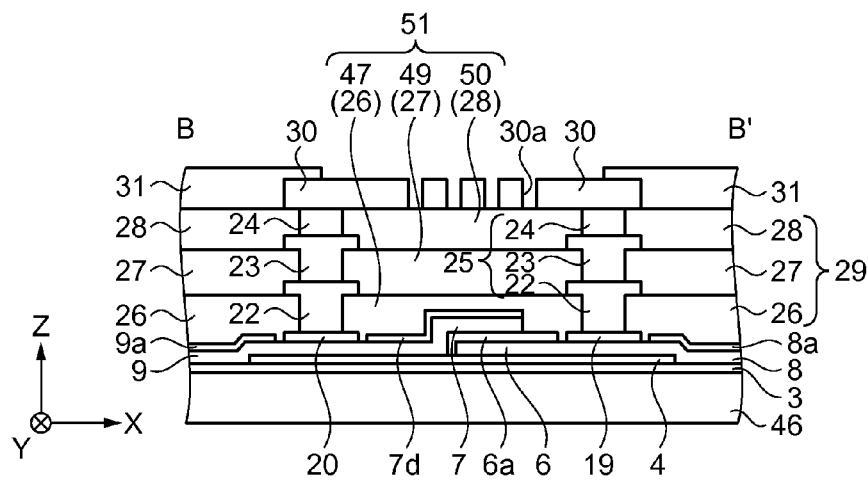

FIGS. 6A and 6B correspond to the second interlayer insulation film forming step in step S5 through the protection film forming step in step S10. As illustrated in FIG. 6A, the second interlayer insulation film forming step in step S5 laminates the second insulation layer 27 on the first insulation layer 26. The second side wall forming step in step S6 forms openings in the second insulation layer 27, and then embeds metal such as aluminum into the openings to produce the fourth enclosure wall 23 and the second through electrodes 35.

The third interlayer insulation film forming step in step S7 laminates the third insulation layer 28 on the second insulation layer 27. The third side wall forming step in step S8 forms openings in the third insulation layer 28, and then embeds metal such as aluminum into the openings to produce the fifth enclosure wall 24 and the third through electrodes 36.

The area of the second insulation layer 27 surrounded by the first enclosure wall 16, the second enclosure wall 17, the first corrosion-resistant insulation film 19, and the second corrosion-resistant insulation film 20 corresponds to a second sacrifice layer 49. Similarly, the area of the third insulation layer 28 surrounded by the first enclosure wall 16, the second enclosure wall 17, the first corrosion-resistant insulation film 19, and the second corrosion-resistant insulation film 20 corresponds to a third sacrifice layer 50. The first sacrifice layer 47, the second sacrifice layer 49, and the third sacrifice layer 50 are collectively referred to as a sacrifice layer 51.

The second insulation layer 27 and the third insulation layer 28 are formed by a method similar to the method for forming the first insulation layer 26, and the same explanation is not repeated. The fourth enclosure wall 23 and the fifth enclosure wall 24 are formed by a method similar to the method for forming the third enclosure wall 22, and the same explanation is not repeated. The second through electrodes 35 and the third through electrodes 36 are formed by a method similar to the method for forming the first through electrodes 34, and the same explanation is not repeated.

The cover forming step in step S9 forms a metal layer 52 produced by laminating a titanium layer, a titanium nitride layer, an aluminum-copper alloy layer, and a titanium nitride layer in this order, and laminates the metal layer 52 on the third insulation layer 28. Subsequently, as illustrated in FIG. 6B, the metal layer 52 is patterned to produce the first sealing layer 30. In this step, the through holes 30a are simultaneously formed in the first sealing layer 30. Then, the metal layer 52 is patterned to form the electrode pads 37 on the third through electrodes 36.

The first sealing layer 30 and the electrode pads 37 are formed by a film forming process such as sputtering and CVD, and then by a patterning process using photolithography technique and etching technique, for example. The first sealing layer 30 and the electrode pads 37 may be produced either by the same process or by separate processes. The third side wall forming step in step S8 and the cover forming step in step S9 may be performed by the same process.

The protection film forming step in step S10 forms the protection film 31 on the area of the third insulation layer 28 other than at least a part of the first sealing layer 30. The protection film 31 is formed by a film forming process such as sputtering and CVD, and then by a patterning process using photolithography technique and etching technique, for example.

Figure 6C:
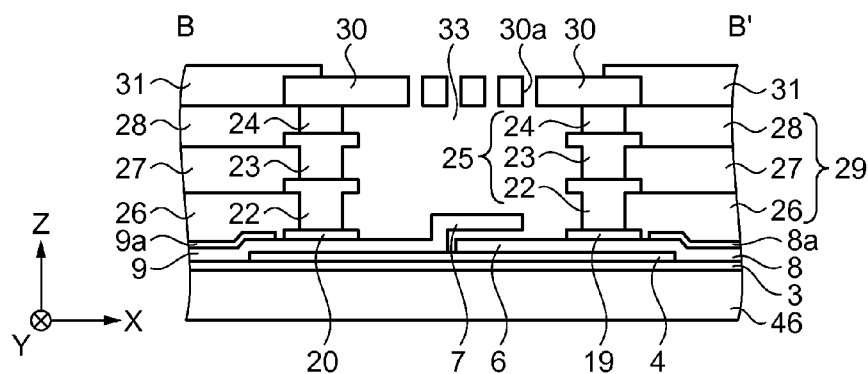

FIG. 6C corresponds to the cavity forming step in step S11. As illustrated in FIG. 6C, the sacrifice layer 51 around the vibrator 5 is etched through the through holes 30a to form the cavity 33. HF vapor etching is employed for etching.

The enclosure wall 25, the first sealing layer 30, and the protection film 31 are made of corrosion-resistant material to etchant. Thus, only the sacrifice layer 51 surrounded by the enclosure wall 25 and the first sealing layer is etched. The insulation layer 29 surrounding the enclosure wall 25 remains without being etched.

The first corrosion-resistant insulation film 19 is provided between the third enclosure wall 22 and the first wiring 8, between the first enclosure wall 16 and the first wiring 8, and between the second enclosure wall 17 and the first wiring 8. This arrangement prevents leakage of etchant used for etching the sacrifice layer 51 from the enclosure wall 25 along the first wiring 8 toward the insulation layer 29. Similarly, the second corrosion-resistant insulation film 20 is provided between the third enclosure wall 22 and the second wiring 9, between the first enclosure wall 16 and the second wiring 9, and between the second enclosure wall 17 and the second wiring 9. This arrangement prevents leakage of etchant used for etching the sacrifice layer 51 from the enclosure wall 25 along the second wiring 9 toward the insulation layer 29.

Figure 7A:
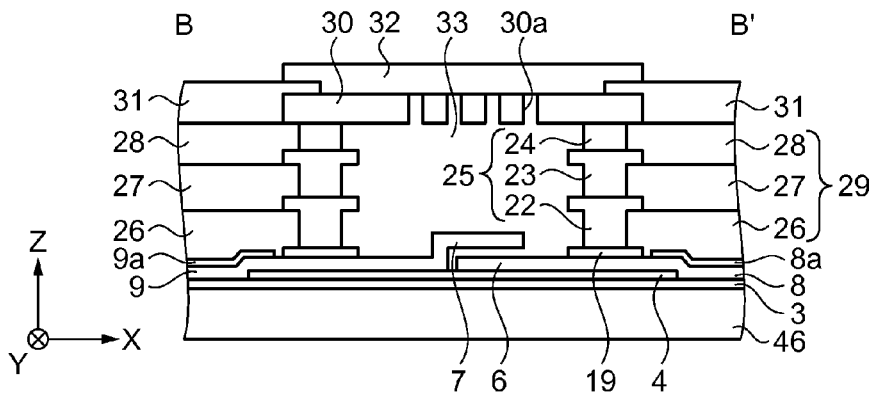
FIGS. 7A through 7C schematically illustrate the method of manufacturing the resonator.

FIG. 7A corresponds to the sealing step in step S12. As illustrated in FIG. 7A, the second sealing layer 32 is provided on the first sealing layer 30 and the protection film 31. This step closes the through holes 30a to seal the cavity 33. The second sealing layer 32 can be formed by a vapor deposition method such as sputtering and CVD. In this case, the second sealing layer 32 is produced under reduced pressure. This condition allows the cavity 33 to be sealed while kept under reduced pressure.

Figure 7B:
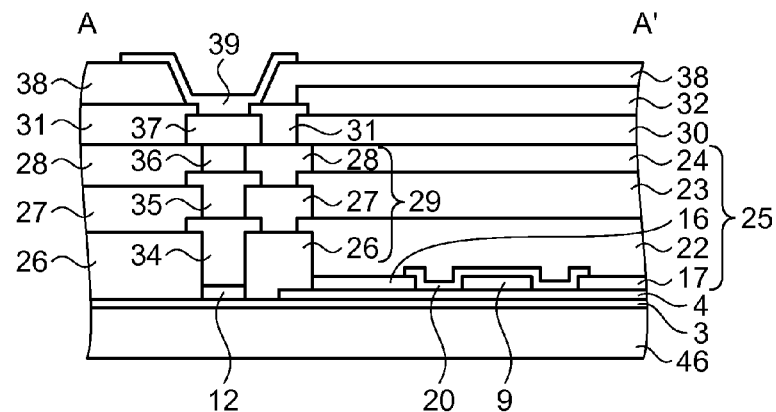
Figure 7C:
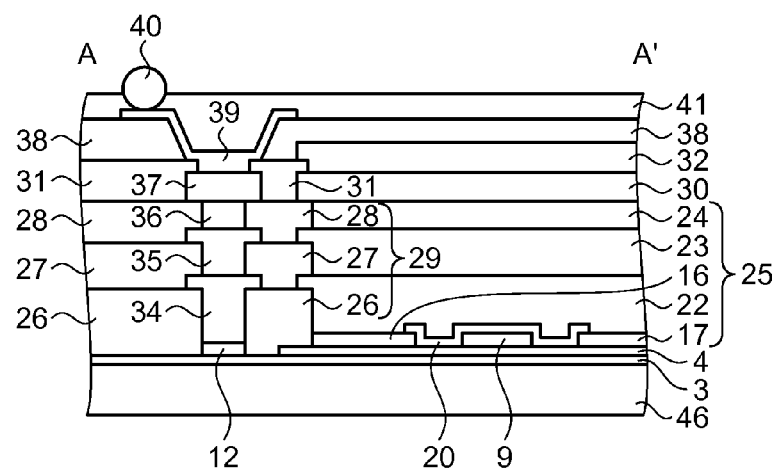

FIGS. 7B and 7C correspond to the terminal forming step in step S13. As illustrated in FIG. 7B, the resin layer 38 is provided on the area of the protection film 31 and the second sealing layer 32 other than the upper surfaces of the electrode pads 37. More specifically, the protection film 31 on the upper surfaces of the electrode pads 37 is initially opened by patterning which uses photolithography technique and etching technique. Then, resin is applied by spin coating, and heat-treated at a temperature approximately in the range from 300° C. to 400° C. in an atmosphere of nitrogen. As a result, the applied resin hardens and forms a film of resin. Finally, the resin film is patterned by photolithography technique and etching technique to form the resin layer 38.

The wirings 39 are provided on the electrode pads 37 and the resin layer 38. The wirings 39 are formed by a film forming method such as sputtering and plating, and a patterning method using photolithography technique and etching technique.

Then, as illustrated in FIG. 7C, the resist layer 41 is provided on the resin layer 38 and the wirings 39. The resist layer 41 is formed on the area other than the positions where the external terminals 40 on the wirings 39 are to be formed. The resist layer 41 is formed by a film forming process such as spin coating, and a patterning process using photolithography technique and etching technique, for example.

Subsequently, the external terminals 40 are provided on the wirings 39. The external terminals 40 are produced by forming a solder film on the wirings 39 and then heating the film at a temperature approximately in the range from 180° C. to 300° C. to fuse the film.

In the dicing step in step S14, the mother substrate 46 is cut along cutting lines. Initially, the mother substrate 46 is affixed to an adhesive sheet. Then, the mother substrate 46 is cut along the cutting lines by using a rotary knife the tip of which is coated with diamond powder. After the cutting, the sheet is spread, whereby the mother substrate 46 is divided along the cutting lines into pieces each of which has the size of the substrate 2. As a result, each of the resonators 1 is separated into a chip shape, and completed into the form shown in FIG. 1.

Accordingly, as described above, the following advantages can be offered in this embodiment.

(1) According to this embodiment, the cavity 33 is produced within the enclosure wall 25 when the sacrifice layer 51 is dissolved by etchant in the cavity forming step in step S11. The enclosure wall 25 is not easily dissolved by etchant, and therefore the range to be dissolved by etchant can be defined by the enclosure wall 25. The first wiring 8 and the second wiring 9 penetrate the enclosure wall 25. When etchant flow out through the clearances between the first wiring 8 and the enclosure wall 25 and between the second wiring 9 and the enclosure wall 25 at the time of formation of the cavity 33, the insulation layer 29 surrounding the enclosure wall 25 dissolves. According to this embodiment, the first corrosion-resistant insulation layer 19 and the second corrosion-resistant insulation layer 20 are provided between the first wiring 8 and the enclosure wall 25 and between the second wiring 9 and the enclosure wall 25, respectively. This structure can prevent flow of etchant from the clearances between the first wiring 8 and the enclosure wall 25 and between the second wiring 9 and the enclosure wall 25 to the outside of the enclosure wall 25.

(2) According to this embodiment, the first corrosion-resistant insulation film 19 and the second corrosion-resistant insulation film 20 are provided between the first wiring 8 and the enclosure wall 25 and between the second wiring 9 and the enclosure wall 25, respectively. The first corrosion-resistant insulation film 19 and the second corrosion-resistant insulation film 20 are more corrosion-resistant to etchant than the sacrifice layer 51. This structure can insulate the first wiring 8 and the second wiring 9 from the enclosure wall 25, and also can prevent flow of etchant from clearances between the first wiring 8 and the enclosure wall 25 and between the second wiring 9 and the enclosure wall 25 to the outside of the enclosure wall 25.

(3) According to this embodiment, the sacrifice layer 51 is made of silicon dioxide, while the first corrosion-resistant insulation layer 19 and the second corrosion-resistant insulation film 20 are made of alumina. Thus, the first corrosion-resistant insulation film 19 and the second corrosion-resistant insulation film 20 have insulating characteristics. When HF vapor etching is employed for etching, for example, the first corrosion-resistant insulation film 19 and the second corrosion-resistant insulation film 20 become more corrosion-resistant than the sacrifice layer 51.

(4) According to this embodiment, the resonator 1 has the vibrator 5 and the oscillation circuit 44 to output the waveform produced by the oscillation circuit 44. The resonator 1 is a high-quality electronic device capable of preventing flow of etchant from the enclosure wall 25. Thus, a high-quality waveform can be outputted from the resonator 1 as a high-quality electronic device.

(5) According to this embodiment, the enclosure wall 25 and the first sealing layer 30 are formed by conductors. In this case, transmission of electromagnetic waves to the vibrator 5 can be blocked by the enclosure wall 25 and the first sealing layer 30 as conductors whose potentials are fixed by grounding, for example. Thus, the effect of electromagnetic waves as noise imposed on the vibrator 5 can be decreased.

(6) According to this embodiment, the pressure inside the cavity 33 is reduced. In this condition, the movable electrode 7 more easily vibrates than when the cavity 33 is filled with air. Thus, the vibrator 5 can vibrate in a high-quality condition.

(7) According to this embodiment, the enclosure wall 25 is disposed at the position overlapping with the first corrosion-resistant insulation film 19 and the second corrosion-resistant insulation film 20. The first corrosion-resistant insulation film 19 and the second corrosion-resistant insulation film 20 are made of alumina. The enclosure wall 25 is made of aluminum-copper alloy. Thus, these components 19, 20, and 25 made of metals having similar coefficients of thermal expansion are not separated from each other at the time of overheating.

Second Embodiment

A resonator according to a second embodiment of the invention is hereinafter described with reference to FIGS. 8 through 11F. This embodiment is different from the first embodiment in the structure for preventing leakage of etchant. In the following description, only the different point is touched upon, and the same explanation is not repeated.

Resonator

Figure 8:
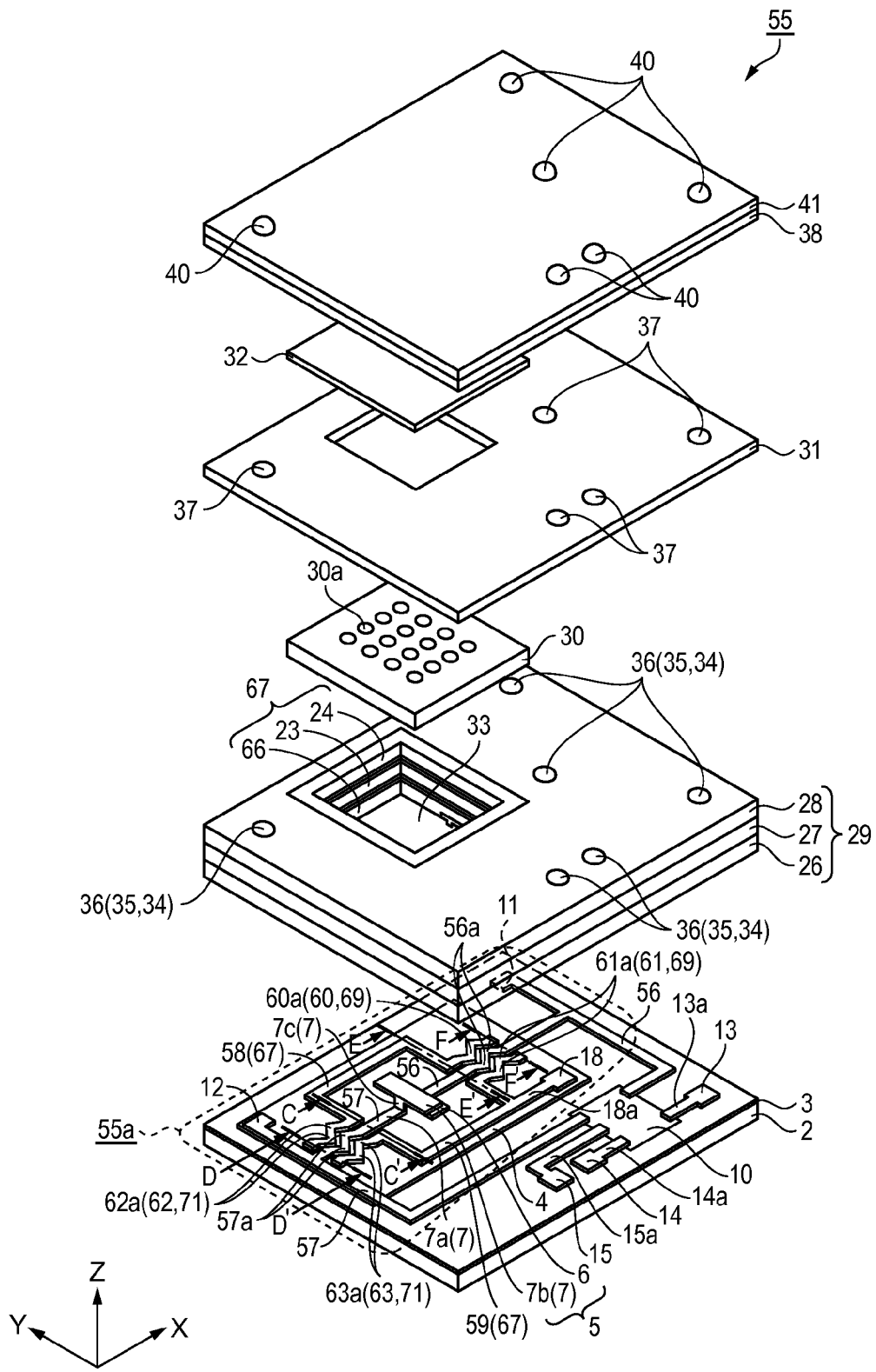
FIG. 8 is a perspective view illustrating the general disassembled structure of a resonator according to a second embodiment.

FIG. 8 is a perspective view of the general disassembled structure of the resonator in this embodiment.

Figure 9A:
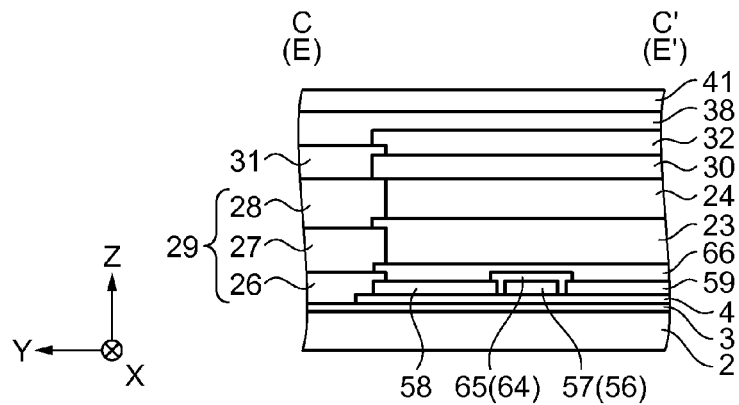
FIG. 9A is a cross-sectional view schematically illustrating the resonator taken along a line C-C' and a line E-E' in FIG. 8.
Figure 9B:
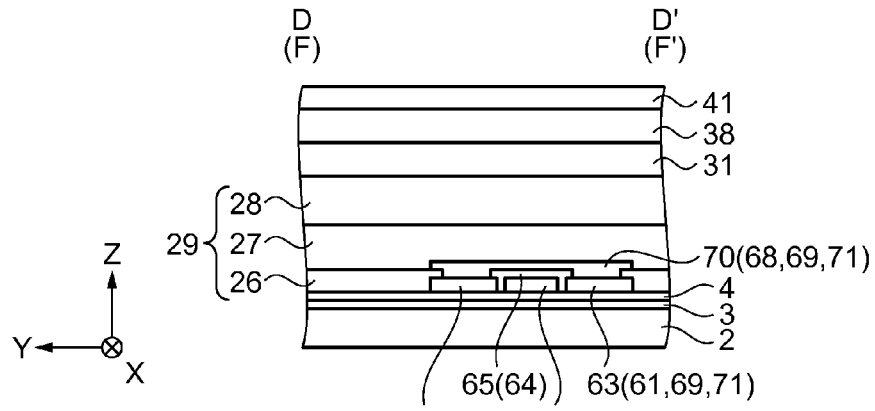
FIG. 9B is a cross-sectional view schematically illustrating the resonator taken along a line D-D' and a line F-F' in FIG. 8, and FIGS. 9C and 9D are enlarged views illustrating a side wall extension as a main part.
Figures 9C, 9D:
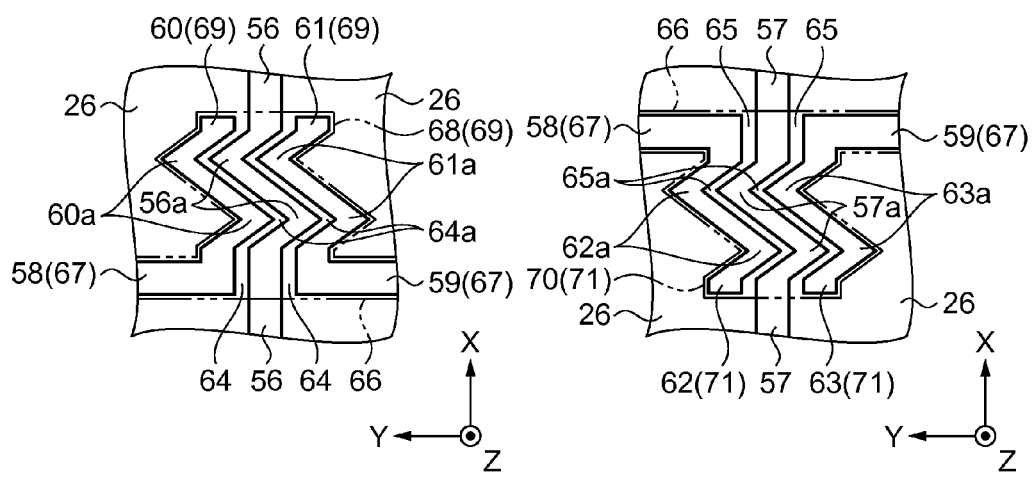

FIG. 9A is a cross-sectional view schematically illustrating the resonator taken along a line C-C' and a line E-E' in FIG. 8. FIG. 9B is a cross-sectional view illustrating the resonator taken along a line D-D' and a line F-F' in FIG. 8. FIGS. 9C and 9D are enlarged views illustrating a side wall extension as a main part. Thus, according to this embodiment, a resonator 55 as an electronic device includes the vibrator 5, and the driving circuit 10 for driving the vibrator 5 as illustrated in FIGS. 8 through 9C. The part of the resonator 55 other than the driving circuit 10 is referred to as an oscillation device 55a.

The resonator 55 includes the substrate 2 on which the first base layer 3 and the second base layer 4 are laminated in this order. The second base layer 4 may be made of silicon nitride as well as alumina. The vibrator 5 as a function element is provided on the second base layer 4 in the vicinity of the center thereof. A third wiring 56 and a fourth wiring 57 are provided on the second base layer 4 as wirings. The third wiring 56 is connected with the fixed electrode 6, while the fourth wiring 57 is connected with the movable electrode 7.

A sixth enclosure wall 58 is provided on the second base layer 4 on the +Y side of the vibrator 5. A seventh enclosure wall 59 is provided on the second base layer 4 on the −Y side of the vibrator 5. One end of the sixth enclosure wall 58 reaches the vicinity of the third wiring 56. The other end of the sixth enclosure wall 58 reaches the vicinity of the fourth wiring 57. Similarly, one end of the seventh enclosure wall 59 reaches the vicinity of the third wiring 56. The other end of the seventh enclosure wall 59 reaches the vicinity of the fourth wiring 57.

The third wiring 56 extends in the +X direction from the fixed electrode 6, and has a shape bended at four bending points 56a in the form of a bended line. A first side wall right extension 60 extends in the direction away from the vibrator 5 from a position where the sixth enclosure wall 58 and the third wiring 56 come close to each other. The first side wall right extension 60 is provided along the third wiring 56. The clearance between the third wiring 56 and the first side wall right extension 60 is kept substantially constant in the area where the third wiring 56 and the first side wall right extension 60 are disposed adjacent to each other. Thus, the first side wall right extension 60 extends in the +X direction from the sixth enclosure wall 58, and has a shape bended at four bending points 60a in the form of a bended line.

Similarly, a first side wall left extension 61 extends in the direction away from the vibrator 5 from a position where the seventh enclosure wall 59 and the third wiring 56 come close to each other. The first side wall left extension 61 is provided along the third wiring 56. The clearance between the third wiring 56 and the first side wall left extension 61 is kept substantially constant in the area where the third wiring 56 and the first side wall left extension 61 are disposed adjacent to each other. Thus, the first side wall left extension 61 extends in the +X direction from the sixth enclosure wall 58, and has a shape bended at four bending points 61a in the form of a bended line.

The clearance between the first side wall right extension 60 and the third wiring 56 is narrow to such an extent as to avoid short circuit. Thus, the third wiring 56 is insulated from the first side wall right extension 60. Similarly, the clearance between the first side wall left extension 61 and the third wiring 56 is narrow to such an extent as to avoid short circuit. Thus, the third wiring 56 is insulated from the first side wall left extension 61.

The fourth wiring 57 extends in the −X direction from the movable electrode 7, and has a shape bended at four bending points 57a in the form of a bended line. A second side wall right extension 62 extends in the direction away from the vibrator 5 from a position where the sixth enclosure wall 58 and the fourth wiring 57 come close to each other. The second side wall right extension 62 is provided along the fourth wiring 57. The clearance between the fourth wiring 57 and the second side wall right extension 62 is kept substantially constant in the area where the fourth wiring 57 and the second side wall right extension 62 are disposed adjacent to each other. Thus, the second side wall right extension 62 extends in the −X direction from the sixth enclosure wall 58, and has a shape bended at four bending points 62a in the form of a bended line.

Similarly, a second side wall left extension 63 extends in the direction away from the vibrator 5 from a position where the seventh enclosure wall 59 and the fourth wiring 57 come close to each other. The second side wall left extension 63 is provided along the fourth wiring 57. The clearance between the fourth wiring 57 and the second side wall left extension 63 is kept substantially constant in the area where the fourth wiring 57 and the second side wall left extension 63 are disposed adjacent to each other. Thus, the second side wall left extension 63 extends in the −X direction from the seventh enclosure wall 59, and has a shape bended at four bending points 63a in the form of a bended line.

The clearance between the second side wall right extension 62 and the fourth wiring 57 is narrow to such an extent as to avoid short circuit. Thus, the fourth wiring 57 is insulated from the second side wall right extension 62. Similarly, the clearance between the second side wall left extension 63 and the fourth wiring 57 is narrow to such an extent as to avoid short circuit. Thus, the fourth wiring 57 is insulated from the second side wall left extension 63.

The sixth enclosure wall 58, the seventh enclosure wall 59, the first side wall right extension 60, the first side wall left extension 61, the second side wall right extension 62, and the second side wall left extension 63 may be made of the same material as that of the first enclosure wall 16 and the second enclosure wall 17. Thus, the materials of these components 58 through 63 may be made of any materials as long as they have electric conductivity and are corrosion-resistant to etchant used for etching silicon dioxide. The materials of the components 58 through 63 may be made of metal or silicon having electric conductivity, for example. According to this embodiment, polycrystalline silicon doped with impurity such as phosphor and boron to acquire electric conductivity is employed, for example.

A fourth insulation layer 64 functioning as an interlayer insulation film is provided between the third wiring 56 and the sixth enclosure wall 58. The fourth insulation layer 64 is also provided between the third wiring 56 and the first side wall right extension 60. Similarly, the fourth insulation layer 64 is provided between the third wiring 56 and the seventh enclosure wall 59. The fourth insulation layer 64 is also provided between the third wiring 56 and the first side wall left extension 61. The fourth insulation layer 64 at bending points 64a between the bending points 56a and the bending points 60a and between the bending points 56a and the bending points 61a is also bended in the form of a bended line. The fourth insulation layer 64 is further provided on the third wiring 56.

Similarly, a fifth insulation layer 65 functioning as an interlayer insulation film is provided between the fourth wiring 57 and the sixth enclosure wall 58. The fifth insulation layer 65 is also provided between the fourth wiring 57 and the second side wall right extension 62. Similarly, the fifth insulation layer 65 is provided between the fourth wiring 57 and the seventh enclosure wall 59. The fifth insulation layer 65 is also provided between the fourth wiring 57 and the second side wall left extension 63. The fifth insulation layers 65 at bending points 65a between the bending points 57a and the bending points 62a and between the bending points 57a and the bending points 63a are also bended in the form of a bended line. The fifth insulation layer 65 is further provided on the fourth wiring 57.

The fourth insulation layer 64 and the fifth insulation layer 65 are connected with the first sacrifice layer 47 and the first insulation layer 26. The fourth insulation layer 64 and the fifth insulation layer 65 are made of silicon dioxide which is the same material as that of the first sacrifice layer 47 and the first insulation layer 26.

An eighth enclosure wall 66 functioning as a covering portion and a side wall is provided on the sixth enclosure wall 58, the seventh enclosure wall 59, the fourth insulation layer 64, and the fifth insulation layer 65. The fourth enclosure wall 23 and the fifth enclosure wall 24 are laminated on the eighth enclosure wall 66. The sixth enclosure wall 58, the seventh enclosure wall 59, the eighth enclosure wall 66, the fourth enclosure wall 23, and the fifth enclosure wall 24 constitute an enclosure wall 67 functioning as a covering portion and a side wall surrounding the vibrator 5. The eighth enclosure wall 66 is a wall corresponding to the third enclosure wall 22 in the first embodiment. The enclosure wall 67 is a wall corresponding to the enclosure wall 25 in the first embodiment.

A first side wall upper extension 68 is provided on the first side wall right extension 60, the first side wall left extension 61, and the fourth insulation layer 64 between the first side wall right extension 60 and the first side wall left extension 61. That is, the first side wall upper extension 68 extended between the first side wall right extension 60 and the first side wall left extension 61 and supported thereby covers the fourth insulation layer 64. The first side wall right extension 60, the first side wall left extension 61, and the first side wall upper extension 68 constitute a first side wall extension 69 functioning as a liquid flow preventing portion and a side wall extension.

Similarly, a second side wall upper extension 70 is provided on the second side wall right extension 62, the second side wall left extension 63, and the fifth insulation layer 65 between the second side wall right extension 62 and the second side wall left extension 63. That is, the second side wall upper extension 70 extended between the second side wall right extension 62 and the second side wall left extension 63 and supported thereby covers the fifth insulation layer 65. The second side wall right extension 62, the second side wall left extension 63, and the second side wall upper extension 70 constitute a second side wall extension 71 functioning as a liquid flow preventing portion and a side wall extension.

Therefore, the fourth insulation layer 64 is sandwiched between the third wiring 56 and the first side wall extension 69 projecting from the enclosure wall 67 toward the insulation layer 29 in the +X direction. Similarly, the fifth insulation layer 65 is sandwiched between the fourth wiring 57 and the second side wall extension 71 projecting from the enclosure wall 67 toward the insulation layer 29 in the −X direction.

Resonator Manufacturing Method

Figure 10:
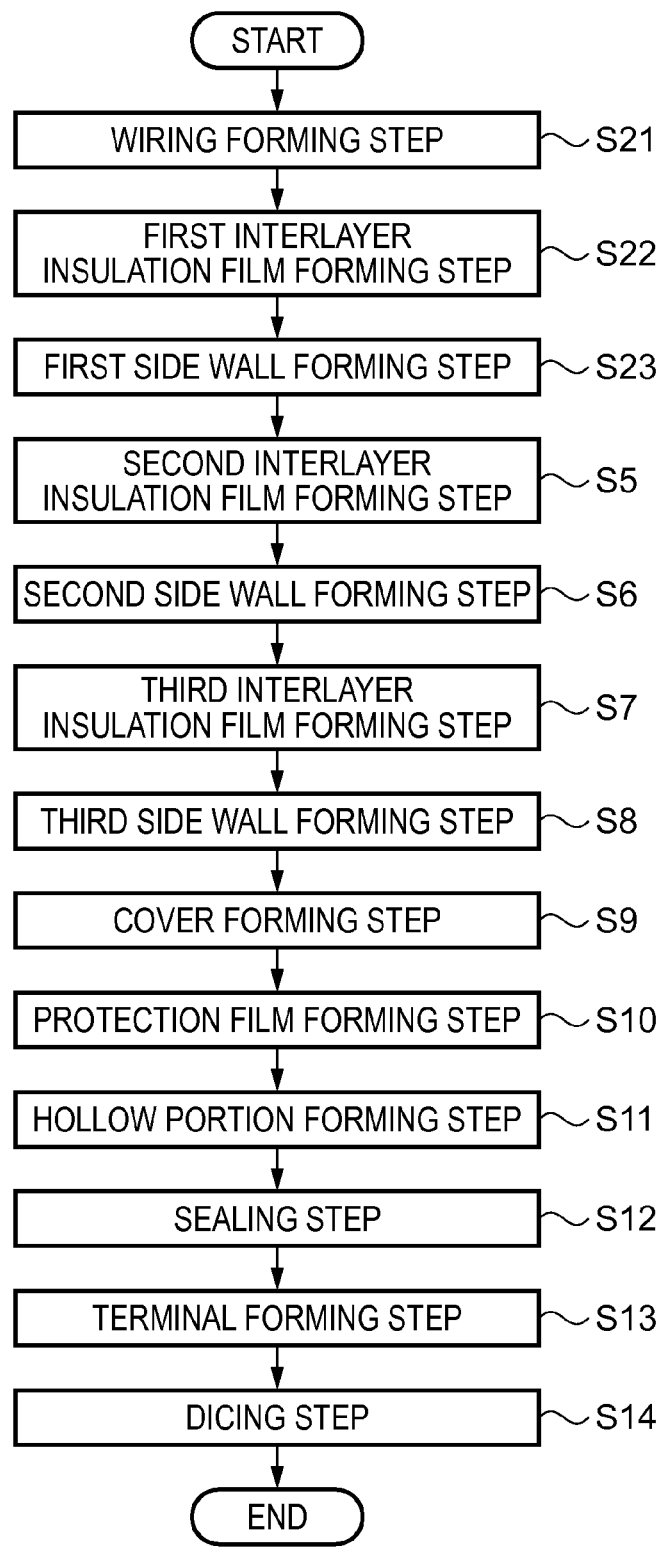
FIG. 10 is a flowchart showing a method of manufacturing the resonator.

A method of manufacturing the resonator 55 described above is now explained with reference to FIG. 10 and FIGS. 11A through 11F. FIG. 10 is a flowchart showing the resonator manufacturing method. FIGS. 11A through 11F schematically illustrate the resonator manufacturing method.

As shown in the flowchart in FIG. 10, step S21 corresponds to a wiring forming step which forms the vibrator, the wirings, the intermediate terminals, the sixth enclosure wall, and the seventh enclosure wall on the substrate. After the end of step S21, the flow proceeds to step S22. Step S22 corresponds to a first interlayer insulation film forming step which forms the first insulation layer, the fourth insulation layer, and the fifth insulation layer. The first interlayer insulation film forming step in step S22, the second interlayer insulation film forming step in step S5, and the third interlayer insulation film forming step in step S7 constitute an interlayer insulation film forming process. After the end of step S22, the flow proceeds to step S23. Step S23 corresponds to a first side wall forming step which forms the eighth enclosure wall, the first side wall upper extension, and the second side wall upper extension. The first side wall forming step in step S23, the second side wall forming step in step S6, and the third side wall forming step in step S8 constitute a side wall forming process. After the end of step S23, the flow proceeds to step S5. The steps after step S5 are similar to the steps after step S5 in the first embodiment, and the same explanation is not repeated. The resonator is completed by these manufacturing steps.

Figure 11A:
FIGS. 11A through 11F schematically illustrate the method of manufacturing the resonator.
Figure 11B:
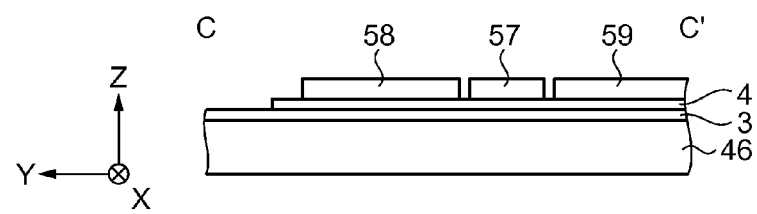

The manufacturing method is herein explained in detail for each step shown in FIG. 10 with reference to FIGS. 11A through 11F. FIGS. 11A and 11B correspond to the wiring forming step in step S21. As illustrated in FIG. 11A, the mother substrate 46 is initially prepared, and the first base layer 3 and the second base layer 4 are provided on the mother substrate 46. The first base layer 3 and the second base layer 4 may be formed by a method similar to the corresponding method in the first embodiment.

Then, as illustrated in FIG. 11B, the fourth wiring 57, the sixth enclosure wall 58, and the seventh enclosure wall 59 are provided on the second base layer 4. In this step, the first side wall right extension 60, the first side wall left extension 61, the second side wall right extension 62, and the second side wall left extension 63 are simultaneously provided. These wirings, enclosure walls, and extensions are formed by a film forming process such as CVD and sputtering, and a patterning process using photolithography technique and etching technique. After a pattern made of polycrystalline silicon is formed, the pattern is doped with a predetermined impurity to acquire electric conductivity.

Figure 11C:
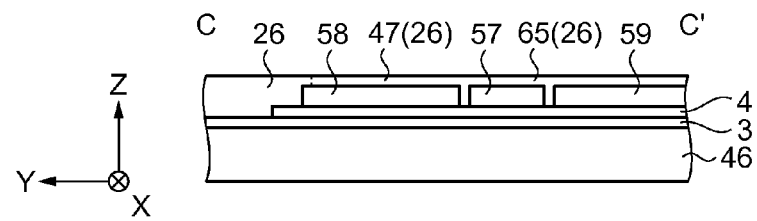

FIG. 11C corresponds to the first interlayer insulation film forming step in step S22. As illustrated in FIG. 11C, the first insulation layer 26 is laminated on the fourth wiring 57, the sixth enclosure wall 58, and the seventh enclosure wall 59. In this step, the first insulation layer is also laminated on the third wiring 56. The first insulation layer 26 is formed by a film forming process such as CVD and sputtering. The area of the first insulation layer 26 surrounded by the sixth enclosure wall 58 and the seventh enclosure wall 59 corresponds to the first sacrifice layer 47. The first insulation layer 26 positioned around the third wiring 56 corresponds to the fourth insulation layer 64. The first insulation layer 26 positioned around the fourth wiring 57 corresponds to the fifth insulation layer 65.

Figure 11D:
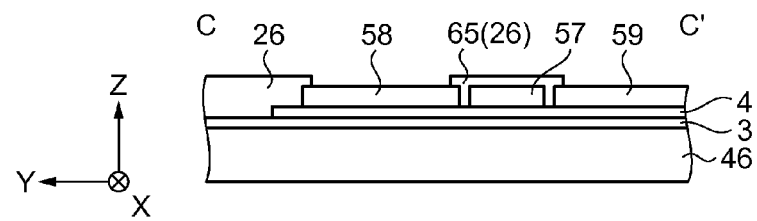
Figure 11E:
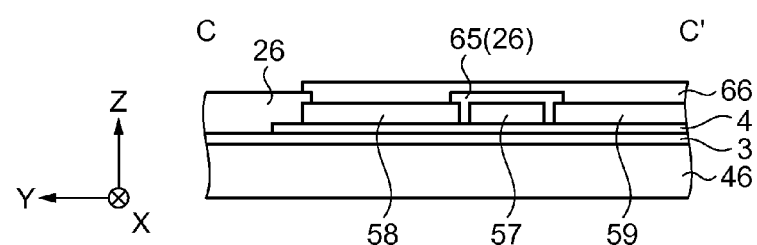
Figure 11F:
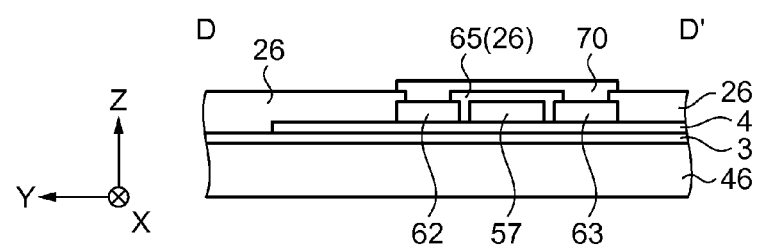

FIGS. 11D through 11F correspond to the first side wall forming step in step S23. As illustrated in FIG. 11D, the first insulation layer 26 positioned on the sixth enclosure wall 58 and the seventh enclosure wall 59 is patterned to produce openings penetrating the first insulation layer 26. Similarly, the first insulation layer 26 positioned on the first side wall right extension 60, the first side wall left extension 61, the second side wall right extension 62, and the second side wall left extension 63 is patterned to produce openings penetrating the first insulation layer 26. The fourth insulation layer 64 and the fifth insulation layer 65 are left without removal.

As illustrated in FIGS. 11E and 11F, the eighth enclosure wall 66 and the second side wall upper extension 70 are formed by embedding metal such as aluminum into the openings. The first side wall upper extension 68 is formed by a similar method. This step produces a structure which covers the fifth insulation layer 65 by the second side wall extension 71, and covers the fourth insulation layer 64 by the first side wall extension 69.

The eighth enclosure wall 66, the first side wall upper extension 68, and the second side wall upper extension 70 are formed by a film forming process such as CVD and sputtering, and a patterning process using photolithography technique and etching technique.

The steps from the second interlayer insulation film forming step in step S5 to the protection film forming step in step S10 as steps performed subsequently to step S23 are similar to the corresponding steps in the first embodiment, and the same explanation is not repeated. The cavity forming step in step S11 etches the sacrifice layer 51 positioned around the vibrator 5 through the through holes 30a provided inside the enclosure wall 67 to produce the cavity 33. The etchant used for etching the sacrifice layer 51 may be hydrofluoric acid or other etchant capable of dissolving silicon oxide film.

The first side wall extension 69 is provided at the position where the third wiring 56 penetrates the enclosure wall 67. The first side wall extension 69 and the third wiring 56 are disposed close to each other to such an extent to avoid short circuit therebetween. The fourth insulation layer 64 is provided between the first side wall extension 69 and the third wiring 56. When the etchant for etching the sacrifice layer 51 shifts along the third wiring 56, the etchant dissolves the fourth insulation layer 64. The etching capability of the etchant decreases in the area where the etchant does not circulate with the progress of etching. The etchant cannot easily shift from the clearance between the first side wall extension 69 and the third wiring 56. Thus, the etchant having dissolved the fourth insulation layer 64 is difficult to further dissolve the fourth insulation layer 64. Accordingly, the etchant cannot easily etch the fourth insulation layer 64 at the position of the first side wall extension 69, which prevents easy leakage of the etchant from the enclosure wall 67 toward the insulation layer 29.

Similarly, the second side wall extension 71 is provided at the position where the fourth wiring 57 penetrates the enclosure wall 67. The second side wall extension 71 has a structure similar to that of the first side wall extension 69. Thus, the etchant cannot easily etch the fifth insulation layer 65 at the position of the second side wall extension 71, which prevents easy leakage of the etchant from the enclosure wall 67 toward the insulation layer 29.

The steps after the sealing step in step S12 performed subsequently to step S11 are similar to the corresponding steps in the first embodiment, and the same explanation is not repeated. By these steps, the resonator 55 shown in FIG. 8 is completed.

Accordingly, as described above, the following advantages can be offered in this embodiment.

(1) According to this embodiment, the fourth insulation layer 64 is provided between the first side wall extension 69 and the third wiring 56. This structure electrically insulates the first side extension 69 from the third wiring 56. Similarly, the fifth insulation layer 65 is provided between the second side wall extension 71 and the fourth wiring 57. This structure electrically insulates the second side extension 71 from the fourth wiring 57. Thus, the enclosure wall 67 can be insulated from the third wiring 56 and the fourth wiring 57.

(2) According to this embodiment, etchant flowing from the sacrifice layer 51 side via the enclosure wall 67 dissolves the fourth insulation layer 64 between the first side wall extension 69 and the third wiring 56. The etchant having dissolved the fourth insulation layer 64 cannot further dissolve the fourth insulation layer 64 with ease with the progress of etching. Thus, the fourth insulation layer 64 is difficult to be dissolved in the area to which the etchant cannot easily flow. Since the first side wall extension 69 has a projecting shape, the etchant having flowed into the space between the first side wall extension wall 69 and the third wiring 56 cannot easily dissolve the fourth insulation layer 64. Therefore, the first side wall extension 69 can prevent flow of the etchant from the enclosure wall 67 toward the insulation layer 29. Similarly, the second side wall extension 71 having the same structure as that of the first side wall extension 69 can prevent flow of the etchant from the enclosure wall 67 toward the insulation layer 29.

(3) According to this embodiment, the fourth insulation layer 64 sandwiched between the first side wall extension 69 and the third wiring 56 has the bending points 64a. The fluid resistance produced during shift of the etchant becomes larger at the bending points 64a than in the linear area of the fourth insulation layer 64. In this case, the etchant does not easily flow at the bending points 64a, and therefore does not easily dissolve the fourth insulation layer 64. Accordingly, flow of the etchant from the enclosure wall 67 toward the insulation layer 29 can be prevented by the presence of the first side wall extension 69. The second side wall extension 71 has the same structure as that of the first side wall extension 69. The fifth insulation layer 65 has the bending points 65a. Thus, flow of the etchant from the enclosure wall 67 toward the insulation layer 29 can be similarly prevented by the presence of the second side wall extension 71.

(4) According to this embodiment, the first side wall right extension 60, the first side wall left extension 61, the second side wall right extension 62, and the second side wall left extension 63 are formed by the method similar to the method for forming the sixth enclosure wall 58 and the seventh enclosure wall 59. Moreover, since the necessity of forming the first corrosion-resistant insulation film 19 and the second corrosion-resistant insulation film 20 required in the first embodiment is eliminated, the step for forming and patterning the alumina layer need not be performed. Thus, the productivity of the manufacture of the resonator 55 improves.

Third Embodiment

A resonator according to a third embodiment of the invention is hereinafter described with reference to FIG. 12. This embodiment is different from the first embodiment in that the step for forming the vibrator 5 and the enclosure wall 25 is performed simultaneously with apart of the step for forming the driving circuit 10. In the following description, only the different point is touched upon, and the same explanation is not repeated.

Figure 12:
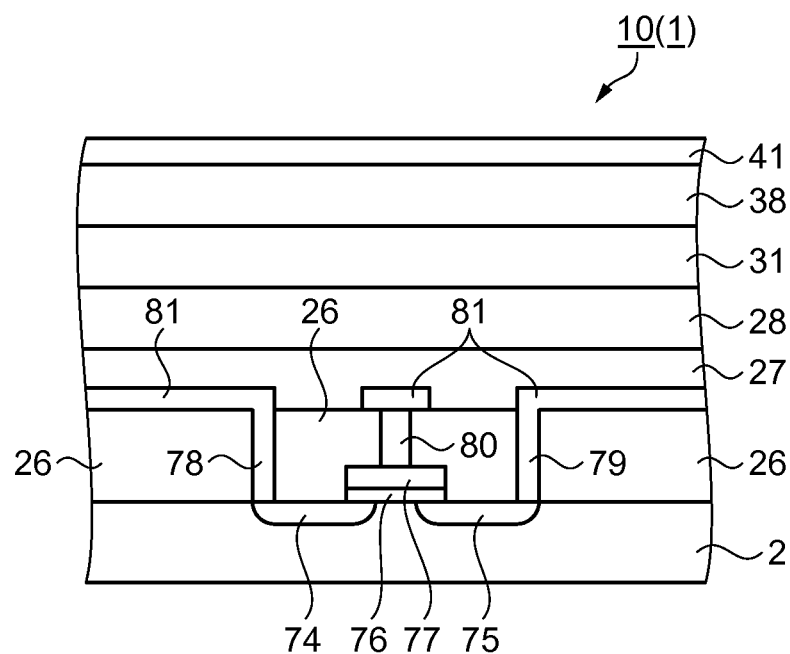
FIG. 12 schematically illustrates the structure of an MOS element included in a driving circuit according to a third embodiment.

FIG. 12 schematically illustrates the structure of an MOS element included in the driving circuit. As illustrated in FIG. 12, the driving circuit 10 has the MOS (metal oxide semiconductor) element. The substrate 2 is doped to form a source region 74 and a drain region 75. A gate insulation film 76 is provided between the source region 74 and the drain region 75. The gate insulation film 76 may be made of any insulating materials. According to this embodiment, the gate insulation film 76 is made of silicon oxide film, for example. The gate insulation film 76 may be formed by silicon thermal oxidation, sputtering, or a vapor deposition method such as CVD.

A gate electrode layer 77 is laminated on the gate insulation film 76. For forming the gate electrode layer 77, a pattern made of polycrystalline silicon is initially formed, and doped with a predetermined impurity to obtain electric conductivity. This process may be carried out in the same step as the step for forming the second wiring 9, the first enclosure wall 16, and the second enclosure wall 17 of the resonator 1.

The first insulation layer 26 is provided on the gate electrode layer 77. The first insulation layer 26 is identical to the first insulation layer 26 provided around the enclosure wall 25. Thus, the first insulation layer 26 according to the embodiment can be formed in the same step as the step for forming the first insulation layer 26 in the first embodiment.

A source electrode 78 is provided on the source region 74. A drain electrode 79 is provided on the drain region 75. A gate electrode 80 is provided on the gate electrode layer 77. For forming the source electrode 78, the drain electrode 79, and the gate electrode 80, openings are initially formed in the first insulation layer 26 by a patterning process using photolithography technique and etching technique. Then, through electrodes are produced by embedding metal such as aluminum into the openings. The through electrodes are formed by a film forming process such as CVD and sputtering, and a patterning process using photolithography technique and etching technique.

A wiring 81 is provided on the first insulation layer 26. The wiring 81 may be formed by using the method for forming the first through electrodes 34 in the first embodiment. The second insulation layer 27, the third insulation layer 28, the protection film 31, the resin layer 38, and the resist layer 41 are laminated on the wiring 81. These layers 27, 28, 31, 38, and 41 are the same layers as those in the first embodiment, and can be formed by the same processes.

Accordingly, as described above, the following advantages can be offered in this embodiment.

(1) According to this embodiment, the MOS element is provided with the gate electrode layer 77 and the first insulation layer 26. The step for forming the second wiring 9 and the step for forming the gate electrode layer 77 of the MOS element are executed in the same process. Moreover, the step for forming the first insulation layer 26, the second insulation layer 27, and the third insulation layer 28 of the insulation layer 29, and the step for forming the first insulation layer 26, the second insulation layer 27, and the third insulation layer 28 of the MOS element are executed in the same process. According to this method, the productivity of the manufacture of the vibrator 5 and the MOS element improves compared with the method which separately forms the vibrator 5 and the MOS element on the substrate 2.

Fourth Embodiment

A clock is hereinafter described with reference to FIG. 13, as an example of an electronic apparatus including the resonator according to a fourth embodiment of the invention. This embodiment is different from the first embodiment in that the resonator is incorporated in an electronic apparatus. In the following description, only the different point is touched upon, and the same explanation is not repeated.

Figure 13:
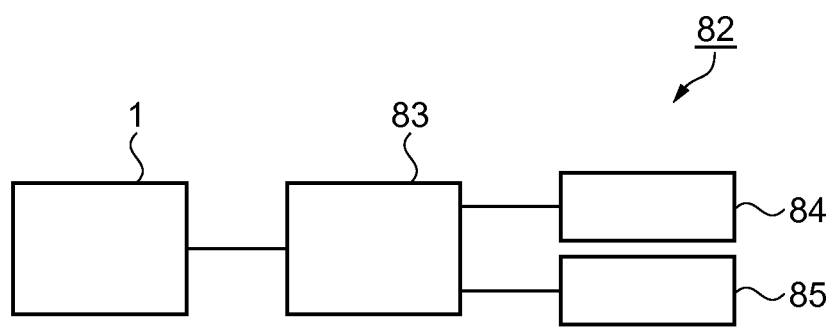
FIG. 13 is an electrical block diagram showing the structure of a clock according to a fourth embodiment.

FIG. 13 is an electric block diagram showing the structure of the clock. As shown in FIG. 13, a clock 82 as an electronic apparatus includes a controller 83. The controller 83 is connected with the resonator 1. The resonator 1 outputs rectangular-wave signals of a fixed frequency to the controller 83. The controller 83 has a calculation unit which performs various calculations in synchronization with the rectangular-wave signals.

The controller 83 has a display unit 84 and an input unit 85. The display unit 84 is a device on which the calculation unit of the controller 83 displays calculation results. The display unit 84 is constituted by a liquid crystal display, an organic EL (electro-luminescence) display, an analog-type display such as hour and minute hands, for example. The input unit 85 is constituted by a push-button type switch or a rotary dial, for example.

The clock 82 has a function of displaying the present time. For displaying the present time, the operator initially inputs time to the clock 82 at a predetermined time through the input unit 85. The controller 83 calculates an elapsed time based on the output from the resonator 1. Then, the controller 83 adds the elapsed time starting from the input of the time to the inputted time to calculate the present time, and outputs the calculated present time to the display unit 84. The display unit 84 displays the present time based on the signal received from the controller 83.

The clock 82 further has a stopwatch function. The operator inputs a command signal for timer start by pushing a button-type switch provided on the input unit 85. The controller 83 calculates an elapse of time based on the output from the resonator 1. Then, the controller 83 calculates the elapsed time starting from the input of the signal for timer start, and outputs the calculated time to the display unit 84. The display unit 84 displays the elapsed time based on the signal received from the controller 83.

According to this embodiment, as described above, the following advantages can be offered in this embodiment.

(1) According to this embodiment, the clock 82 includes the resonator 1. The resonator 1 is a high-quality device capable of preventing leakage of etchant from the enclosure wall 25. Thus, the clock 82 becomes an excellent apparatus provided with the high-quality resonator 1.

It should be noted that the invention is not limited to the respective embodiments described herein, and therefore various modifications and changes including the following modified examples may be made.

Modified Example 1

According to the first embodiment, the vibrator 5 is provided as an electrically driven function element disposed in the cavity 33 formed within the enclosure wall 25. The electrically driven function element is not limited to the vibrator 5 but may be other elements such as an acceleration sensor having a weight on the free end of its beam, a gyro sensor, a quartz resonator, an SAW (surface acoustic wave) element, and a micro actuator movable by a comb-like electrode. The function element constituted by these devices can be driven in a high-quality condition due to their structure capable of preventing flow of etchant from the enclosure wall 25.

Modified Example 2

According to the first embodiment, HF vapor etching is used for etching the sacrifice layer 51. However, the sacrifice layer 51 may be etched by other methods. For example, the sacrifice layer 51 may be etched by using hydrofluoric acid, buffered hydrofluoric acid or other chemicals as etchant. In this case, it is preferable that a corrosion-resistant film to etchant is provided on the second base layer 4. The corrosion-resistant material to etchant used for this film is not specifically limited. For example, this film may be made of SiN, titanium, aluminum, or gold. The presence of this film allows the sacrifice layer 51 to be removed in a high-quality condition.

Modified Example 3

According to the first embodiment, the enclosure wall 25 has three enclosure walls of the third enclosure wall 22, the fourth enclosure wall 23, and the fifth enclosure wall 24 disposed on the first enclosure wall 16 and the second enclosure wall 17. The insulation layer 29 has three insulation layers of the first insulation layer 26, the second insulation layer 27, and the third insulation layer 28. The number of the enclosure walls and the number of the insulation layers are not specifically limited but may be 1 or 2 layers, or 4 or a larger number of layers. These numbers may be determined according to the size of the vibrator 5, and the factors for the manufacturing steps such that the large-sized vibrator 5 can be used, and that the degree of freedom for the design of the steps can be raised.

Modified Example 4

According to the first embodiment, the planar shape of the enclosure wall 25 is a quadrangular frame shape as illustrated in FIG. 1. However, the planar shape of the enclosure wall 25 may be any shapes as long as they can surround the vibrator, such as circular, elliptical, and polygonal frame shapes. Thus, the degree of freedom for positioning the wires, the terminals, and the driving circuit 10 increases. The modified examples 1 through 4 are applicable to the second embodiment as well.

Modified Example 5

While the resonator 1 is used in the fourth embodiment, the resonator 55 may be employed in place of the resonator 1. In this case, a waveform of a predetermined frequency can be similarly produced in a high-quality condition.

Modified Example 6

While the clock 82 has been discussed as an example of the electronic apparatus including the resonator 1, the resonator 1 may be incorporated in various types of electronic apparatuses as well as the clock 82. For example, the resonator 1 may be employed for a cellular phone, a personal computer, an electronic dictionary, a digital camera, a digital sound recording and reproducing device, or others. Each of these devices including the resonator 1 becomes an electronic apparatus provided with a high-quality oscillator capable of outputting a waveform of a predetermined frequency in a high-quality condition.

Modified Example 7

According to the third embodiment, apart of the step for forming the MOS element of the driving circuit 10 and a part of the step for forming the resonator 1 in the first embodiment are performed in the same process. However, a part of the step for forming the MOS element of the driving circuit 10 and a part of the step for forming the resonator 55 in the second embodiment may be performed in the same process. More specifically, the step for forming the fourth wiring 57 and the step for forming the gate electrode layer 77 of the MOS element may be performed in the same process. Moreover, the step for forming the first insulation layer 26, the second insulation layer 27, and the third insulation layer 28 of the insulation layer 29, and the step for forming the first insulation layer 26, the second insulation layer 27, and the third insulation layer 28 of the MOS element are performed in the same process. In this case, the vibrator 5 and the MOS element can be manufactured with higher productivity than that of the vibrator 5 and the MOS element manufactured by the method which executes the step for forming the vibrator 5 and the step for forming the MOS element separately.

The entire disclosure of Japanese Patent Application No. 2010-266215, filed Nov. 30, 2010 is expressly incorporated by reference herein.

What is claimed is:

1. An electronic device comprising:
   a function element disposed within a cavity on a substrate and electrically driven;
   a covering portion which has electric conductivity and sections the cavity from an interlayer insulation film surrounding the circumference of the cavity;
   a wiring which connects with the function element and penetrates the covering portion; and
   a liquid flow preventing portion disposed at the position where the wiring penetrates the covering portion to prevent flow of etchant dissolving the interlayer insulation film from the cavity toward the interlayer insulation film and insulate the wiring from the covering portion, wherein the liquid flow preventing portion has a side wall extension which projects from the covering portion toward the interlayer insulation film.

2. The electronic device according to claim 1, wherein the liquid flow preventing portion has a corrosion-resistant insulation film more corrosion-resistant to the etchant than the interlayer insulation film; and the corrosion-resistant insulation film is disposed between the wiring and the covering portion.

3. The electronic device according to claim 2, wherein the interlayer insulation film is made of silicon dioxide; and the corrosion-resistant insulation film is made of alumina.

4. The electronic device according to claim 1, wherein the interlayer insulation film is sandwiched between the side wall extension and the wiring.

5. The electronic device according to claim 4, wherein the interlayer insulation film sandwiched between the side wall extension and the wiring has a bending point.

6. An electronic apparatus, comprising:
an oscillation circuit,
wherein the oscillation circuit includes the electronic device according to claim 1.

7. An electronic apparatus, comprising:
an oscillation circuit,
wherein the oscillation circuit includes the electronic device according to claim 2.

8. An electronic apparatus, comprising:
an oscillation circuit,
wherein the oscillation circuit includes the electronic device according to claim 3.

9. An electronic apparatus, comprising:
an oscillation circuit,
wherein the oscillation circuit includes the electronic device according to claim 4.

10. An electronic apparatus, comprising:
an oscillation circuit,
wherein the oscillation circuit includes the electronic device according to claim 5.

11. An electronic device, comprising:
a substrate;
a covering portion disposed on the substrate such that a part of the covering portion is opposed to another part of the covering portion with a gap interposed between the opposed parts;
an insulation film disposed on the substrate in such a position as to surround the covering portion in the plan view as viewed in the substrate thickness direction;
a function element having an electrode and disposed in a space whose outer periphery is defined by the substrate and the covering portion; and
a wiring disposed on the substrate and extending between the space and the insulation film in the plan view as viewed in the substrate thickness direction to connect with the electrode,
wherein
the covering portion has a side wall surrounding the function element in the plan view as viewed in the substrate thickness direction, and a cover disposed away from the function element and closing the upper part of the space, and
the side wall has a second insulation film disposed in contact with the wiring and containing a material different from the material of the insulation film, and a conductive portion disposed in contact with the second insulation film.

12. The electronic device according to claim 11, wherein the second insulation film is made of material which is more etching-resistant to hydrofluoric acid than the material of the insulation film.

13. An electronic device comprising:
a substrate;
a covering portion which is disposed on the substrate such that a part of the covering portion is opposed to another part of the covering portion with a gap interposed between the opposed parts, and has electric conductivity;
an insulation film disposed on the substrate in such a position as to surround the covering portion in the plan view as viewed in the substrate thickness direction;
a function element having an electrode and disposed in a space whose outer periphery is defined by the substrate and the covering portion; and
a wiring disposed on the substrate and extending between the space and the insulation film in the plan view as viewed in the substrate thickness direction to connect with the electrode,
wherein
the covering portion has a side wall surrounding the function element in the plan view as viewed in the substrate thickness direction, and a cover disposed away from the function element and closing the upper part of the space,
the side wall at the position where the wiring penetrates the covering portion has a side wall extension extending toward the insulation film in the plan view as viewed in the substrate thickness direction, and
the insulation film extends between the side wall extension and the wiring.

* * * * *